(12) United States Patent
Lai et al.

(10) Patent No.: US 11,568,781 B2
(45) Date of Patent: Jan. 31, 2023

(54) DISPLAY PANEL AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Yong Yuan, Shanghai (CN); Ping An, Shanghai (CN); Zhaokeng Cao, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/643,557

(22) Filed: Dec. 9, 2021

(65) Prior Publication Data

US 2022/0254291 A1 Aug. 11, 2022

(30) Foreign Application Priority Data

Feb. 5, 2021 (CN) .......................... 202110164268.9

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2017/0301295 A1* | 10/2017 | Park ..................... | G09G 3/3291 |
| 2019/0325845 A1* | 10/2019 | Zhu ...................... | G09G 3/2074 |
| 2020/0066209 A1* | 2/2020 | Zhang .................. | G11C 19/28 |
| 2020/0265877 A1* | 8/2020 | Zheng .................... | G09G 3/20 |
| 2021/0193025 A1* | 6/2021 | Xu ....................... | G09G 3/3266 |
| 2021/0335263 A1* | 10/2021 | Byun ................... | G09G 3/3266 |
| 2022/0199029 A1* | 6/2022 | Xiao .................... | H01L 27/124 |

FOREIGN PATENT DOCUMENTS

CN 103632633 B 8/2016

* cited by examiner

*Primary Examiner* — Christopher J Kohlman

(74) *Attorney, Agent, or Firm* — Anova Law Group PLLC

(57) ABSTRACT

A display panel and a display device are provided. The display panel includes a driving circuit. The driving circuit includes N levels of shift registers cascaded with each other, where N ≥ 2. A shift register of the N levels of shift registers includes: a first control unit, configured to receive an input signal and control a signal of a first node in response to a first clock signal; a second control unit, configured to receive a first voltage signal and a second voltage signal, and control a signal of a second node in response to the signal of the first node, the first clock signal, and a second clock signal; and a third control unit, configured to receive the first voltage signal and the second voltage signal, and control an output signal in response to the signal of the second node and a signal of the third node.

20 Claims, 12 Drawing Sheets

DISPLAY PANEL AND DISPLAY DEVICE

CROSS-REFERENCE TO RELATED APPLICATION

This application claims priority of Chinese Patent Application No. 202110164268.9, filed on Feb. 5, 2021, the entire content of which is hereby incorporated by reference.

FIELD OF THE DISCLOSURE

The present disclosure generally relates to the field of display technology and, more particularly, relates to a display panel and a display device.

BACKGROUND

Nowadays, display technology is widely used in display of televisions, mobile phones and public information, bringing great convenience to people's daily life and work. In existing technologies, a display panel used for displaying an image needs to use a scan driving circuit to provide driving signals to pixel circuits, for controlling the display panel to realize a function of performing a scan. Accordingly, image data input to the display panel may be refreshed in real time, and thus dynamic display may be realized.

However, an output signal of an existing scan driving circuit may be unstable, and display effects may thus be affected.

SUMMARY

One aspect of the present disclosure includes a display panel. The display panel includes a driving circuit. The driving circuit includes N levels of shift registers cascaded with each other, where $N \geq 2$. A shift register of the N levels of shift registers includes: a first control unit, configured to receive an input signal and control a signal of a first node in response to a first clock signal; a second control unit, configured to receive a first voltage signal and a second voltage signal, and control a signal of a second node in response to the signal of the first node, the first clock signal, and a second clock signal; and a third control unit, configured to receive the first voltage signal and the second voltage signal, and control an output signal in response to the signal of the second node and a signal of the third node. The third node is connected to the first node, the first voltage signal is a high-level signal, and the second voltage signal is a low-level signal. The second control unit includes an adjustment unit; and the adjustment unit is configured to, when the signal of the first node and the signal of the third node are each a low-level signal, and the second clock signal is a low-level signal, maintain the low-level signal of the first node.

Another aspect of the present disclosure includes a display device. The display device includes a display panel. The display panel includes a driving circuit. The driving circuit includes N levels of shift registers cascaded with each other, where $N \geq 2$. A shift register of the N levels of shift registers includes: a first control unit, configured to receive an input signal and control a signal of a first node in response to a first clock signal; a second control unit, configured to receive a first voltage signal and a second voltage signal, and control a signal of a second node in response to the signal of the first node, the first clock signal, and a second clock signal; and a third control unit, configured to receive the first voltage signal and the second voltage signal, and control an output signal in response to the signal of the second node and a signal of the third node. The third node is connected to the first node, the first voltage signal is a high-level signal, and the second voltage signal is a low-level signal. The second control unit includes an adjustment unit; and the adjustment unit is configured to, when the signal of the first node and the signal of the third node are each a low-level signal, and the second clock signal is a low-level signal, maintain the low-level signal of the first node.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

It should be noted that in the present disclosure, relational terms such as "first" and "second" are used only to distinguish one entity or operation from another entity or operation, and do not necessarily require or imply any such actual relationship or order between these entities or operations. Moreover, terms "include", "comprise" or any other variations thereof are intended to cover non-exclusive inclusion. A process, a method, an article, or an equipment including a series of elements may not only include those elements, but also include other elements that are not explicitly listed, or elements inherent to the process, the method, the article, or the equipment. Without additional restrictions, when a phrase "including . . . " is used to identify an element, other identical elements may exist in a process, a method, an article, or an equipment including the element.

Figure 1:
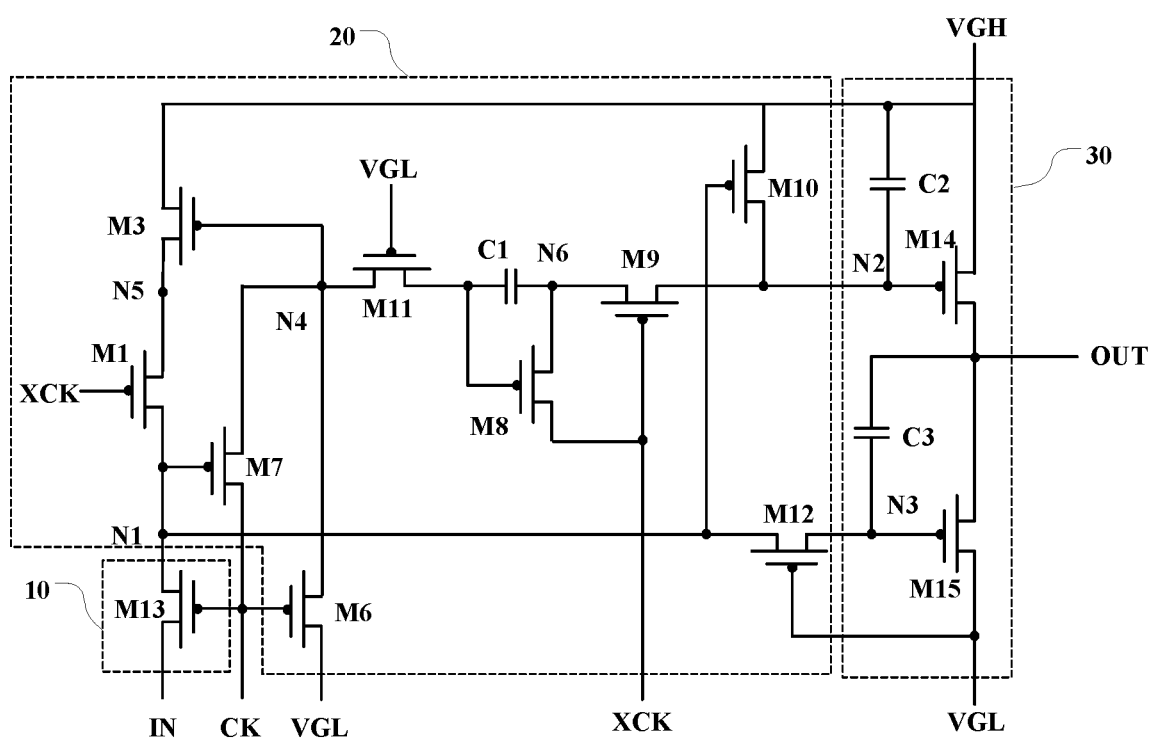
FIG. 1 illustrates a schematic circuit diagram of a shift register according to an existing technology.
Figure 2:
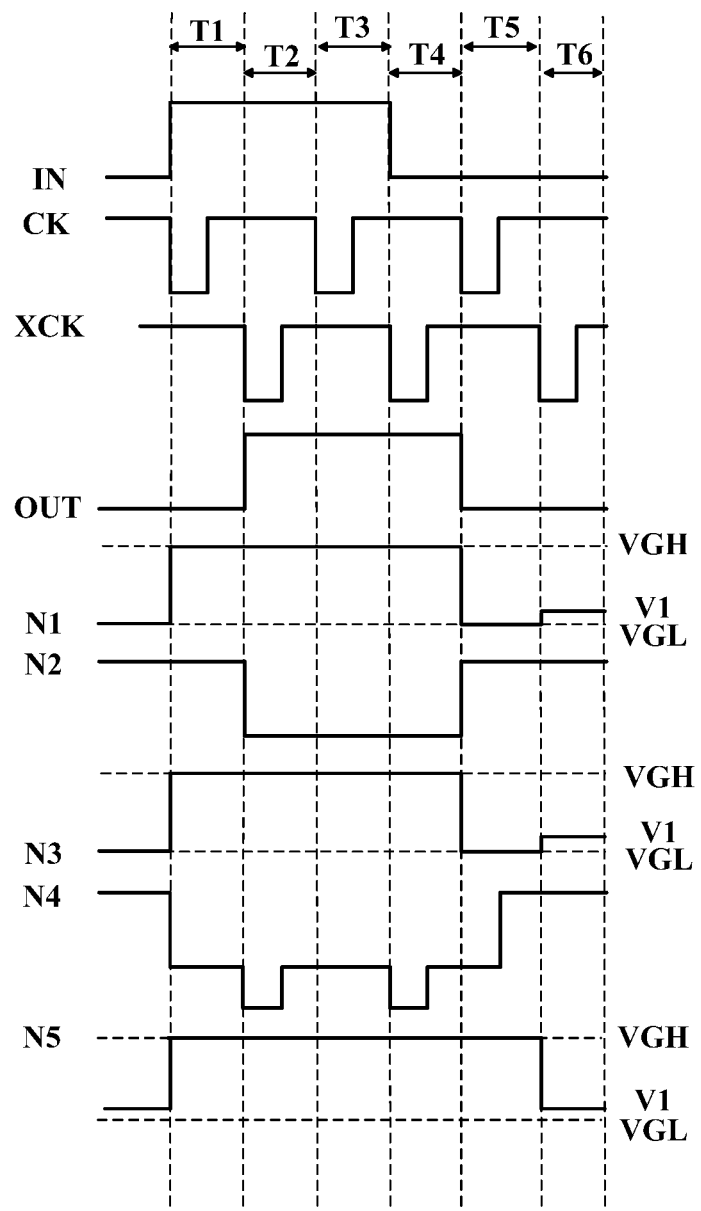
FIG. 2 illustrates a driving timing diagram of a shift register described in FIG. 1.

To solve a problem of unstable output signals of a driving circuit in a display panel, the inventor conducted a following research. FIG. 1 illustrates a schematic circuit diagram of a shift register according to an existing technology. FIG. 2 illustrates a driving timing diagram of a shift register described in FIG. 1. With reference to FIG. 1 and FIG. 2, in a period T1, an input signal IN is at a high level, a clock signal CK is at a low level, a transistor M13 is turned on. The input signal IN is transmitted to a first node N1, and thus the first node N1 is at a high level. A transistor M12 is turned on, potential of the first node N1 is transmitted to a third node N3, and thus the third node N3 is at a high level. A transistor M6 is turned on, and a fourth node N4 is at a low level, a transistor M3 is turned on, a fifth node N5 is at a high level, a clock signal XCK is at a high level, a second node N2 remains at a high level, and an output signal OUT remains outputting a low level.

During a period T2, the input signal IN is at a high level, the clock signal CK is at a high level, the transistor M13 is turned off, the first node N1 remains at a high level, the transistor M12 is turned on, and the potential of the first node N1 is transmitted to the third node N3, the third node N3 remains at a high level, the transistor M6 is turned off, the fourth node N4 remains at a low level, the transistor M3 is turned on, the fifth node N5 is at a high level, the clock signal XCK is at a low level, the second node N2 becomes to be at a low level, and the output signal OUT remains outputting a high level.

During a period T3, the input signal IN is at a high level, the clock signal CK is at a low level, the transistor M13 is turned on, and the input signal IN is transmitted to the first node N1. The first node N1 is at a high level and the transistor M12 is turned on. The potential of the first node N1 is transmitted to the third node N3, and the third node N3 is at a high level. The transistor M6 is turned on, the fourth node N4 is at a low level, the transistor M3 is turned on, the fifth node N5 is at a high level, the clock signal XCK is at a high level, the second node N2 remains at a low level, and the output signal OUT remains outputting a high level.

In a period T4, the input signal IN is at a low level, the clock signal CK is at a high level, the transistor M13 is turned off, the first node N1 remains at a high level, the transistor M12 is turned on, and the potential of the first node N1 is transmitted to the third node N3 and the third node N3 remains at a high level, the transistor M6 is turned off, the fourth node N4 is kept at a low level, the transistor M3 is turned on, the fifth node N5 is at a high level, the clock signal XCK is at a low level, the second node N2 remains at a low level, and the output signal OUT remains outputting a high level.

In a period T5, the input signal IN is at a low level, the clock signal CK is at a low level, the transistor M13 is turned on, the input signal IN is transmitted to the first node N1 such that the first node N1 is at a low level. The transistor M12 is turned on, the potential of the first node N1 is transmitted to the third node N3, and the third node N3 is at a low level. The transistor M6 is turned on, the fourth node N4 is at a low level, the transistor M3 is turned on, the fifth node N5 is at a high level, and the clock signal XCK is at a high level. The transistor M10 is turned on, the second node N2 is at a high level, and the output signal OUT remains outputting a low level.

In a period T6, the input signal IN is at a low level, the clock signal CK is at a high level, the transistor M13 is turned off, the first node N1 remains at a low level, the transistor M12 is turned on, and the potential of the first node N1 is transmitted to the third node N3 and the third node N3 remains at a low level, the transistor M6 is turned off, the seventh transistor M7 is turned on, the fourth node N4 is at a high level, the transistor M3 is turned on, the fifth node N5 is at a high level, the clock signal XCK is at a low level, the second node N2 becomes to be at a high level, and the output signal OUT remains outputting a low level.

Since in the period T5, the clock signal CK is at a low level, the clock signal XCK is at a high level, and the first node N1 is at a low level, the transistor M1 is turned off, the transistor M3 is turned on, and the fifth node N5 is at a high level. In the period T6, the clock signal CK is at a high level, the clock signal XCK is at a low level, the transistor M3 is turned off, the transistor M13 is turned off, the first node N1 and the fifth node N5 are each a floating node. The transistor M1 is turned on, and electric charge may be conducted between the first node N1 and the fifth node N5. Since the first node N1 is at a low level and the fifth node N5 is at a high level, the first node N1 may pull down the potential of the fifth node N5, and the fifth node N5 may raise the potential of the first node N1. A rise of the potential of the first node N1 may cause a rise of the potential of the third node N3. Accordingly, a state of the transistor M15 may be affected, and a instability problem of the output signal OUT may be caused.

The present disclosure provides a display panel and a display device, and a problem of unstable output signals of a driving circuit in existing technologies may thus be solved. Regarding the display panel provided by the present disclosure, details are described below.

Figure 3:
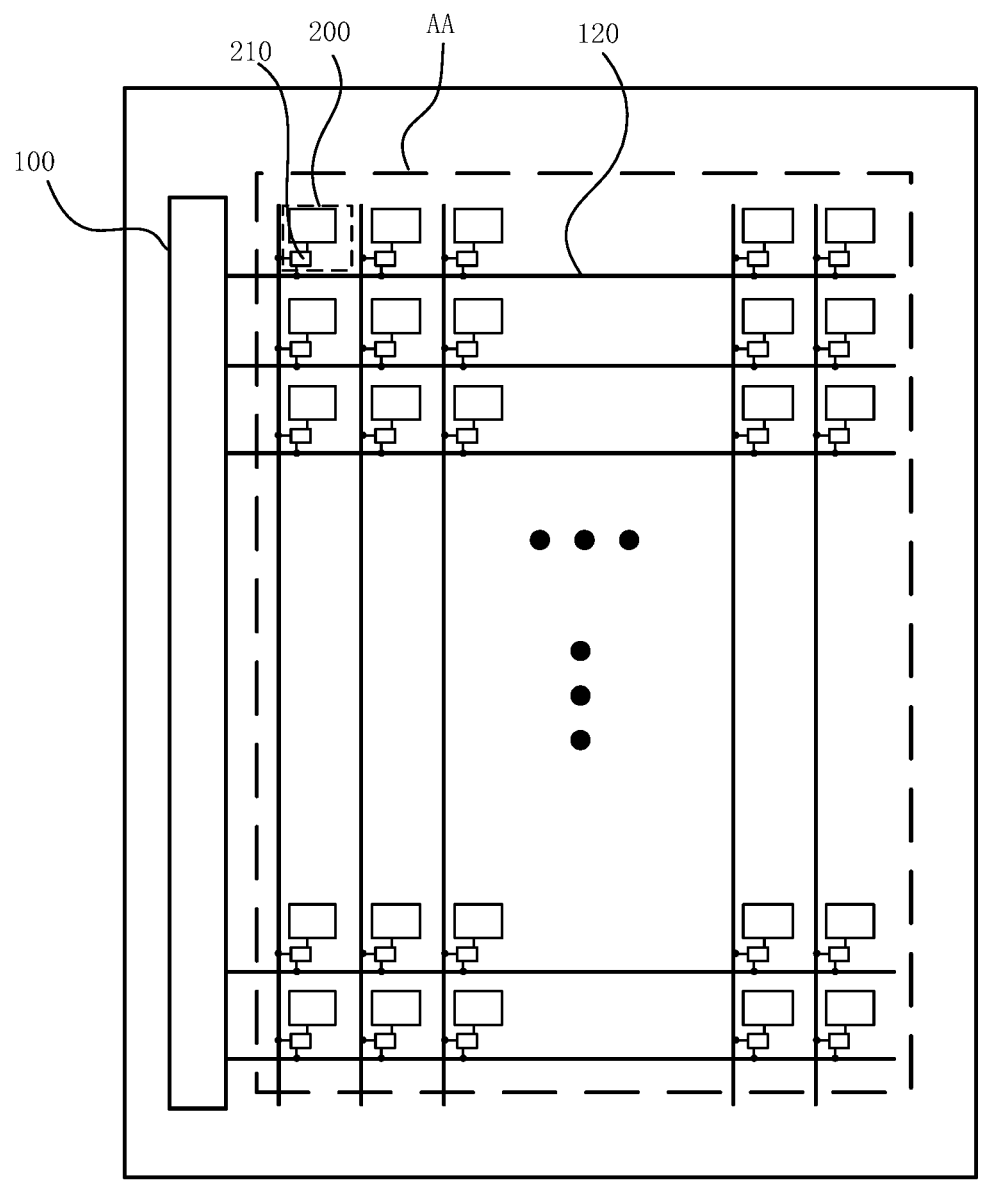
FIG. 3 illustrates a schematic plan view of a display panel consistent with the disclosed embodiments of the present disclosure.

FIG. 3 illustrates a schematic plan view of a display panel consistent with the disclosed embodiments of the present disclosure. With reference to FIG. 3, the display panel includes a driving circuit 100 and a plurality of pixels 200.

Each pixel 200 of the plurality of pixels 200 is provided with a pixel circuit 210. The driving circuit 100 is connected to the pixel circuit 210 through a signal line to provide a driving signal to the pixel circuit 210, such that the pixel circuit 210 may drive the pixel 200 to emit light and display an image.

It should be noted that FIG. 3 only takes a structure of a display panel as an example for description. FIG. 3 exemplarily shows that the driving circuit 100 may be located on one side of the display panel. In some other embodiments, the driving circuit 100 may also be located on two sides of the display panel, and such a configuration is not described in detail in the present disclosure.

Figure 4:
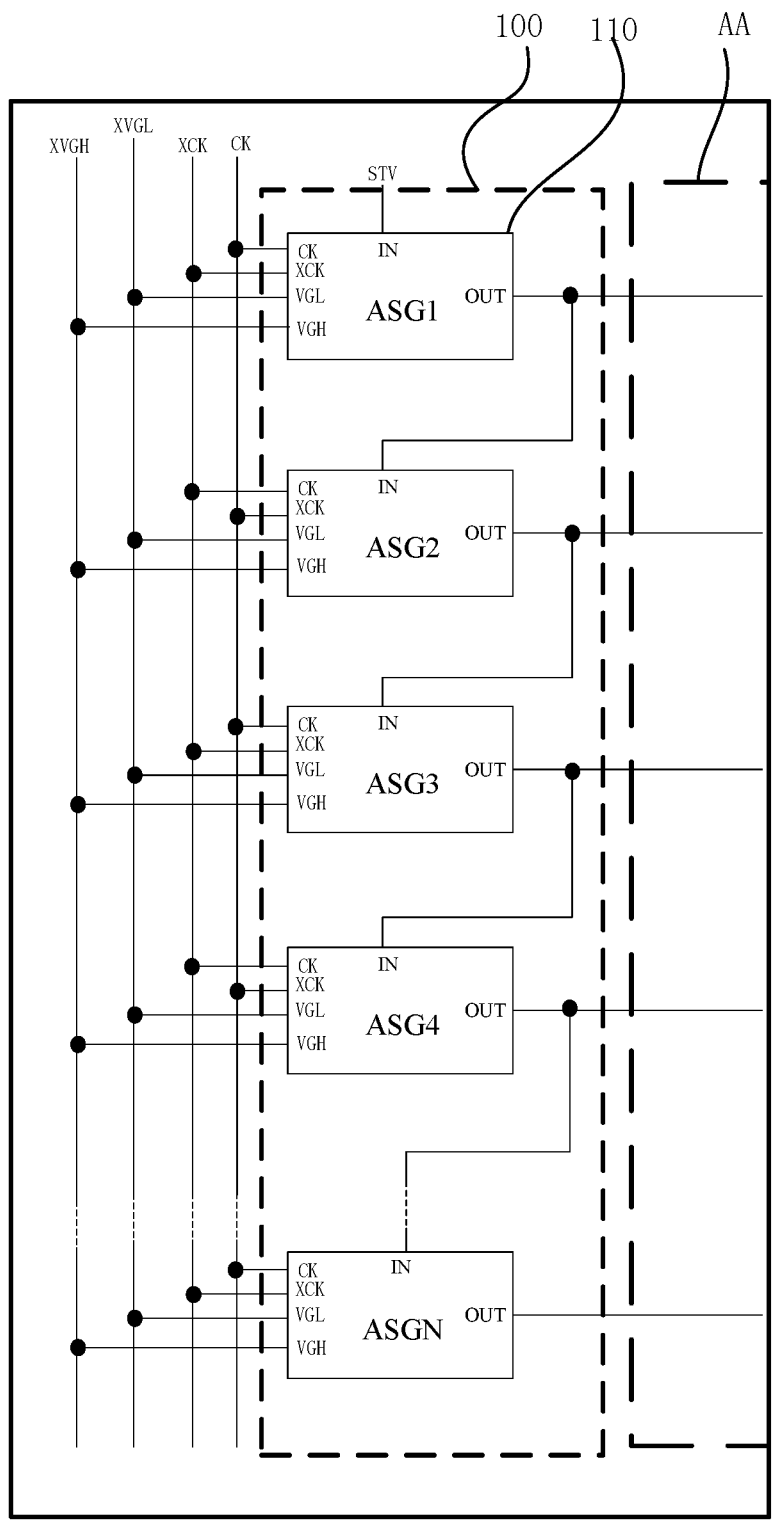
FIG. 4 illustrates a schematic structural diagram of a driving circuit consistent with the disclosed embodiments of the present disclosure.
Figure 5:
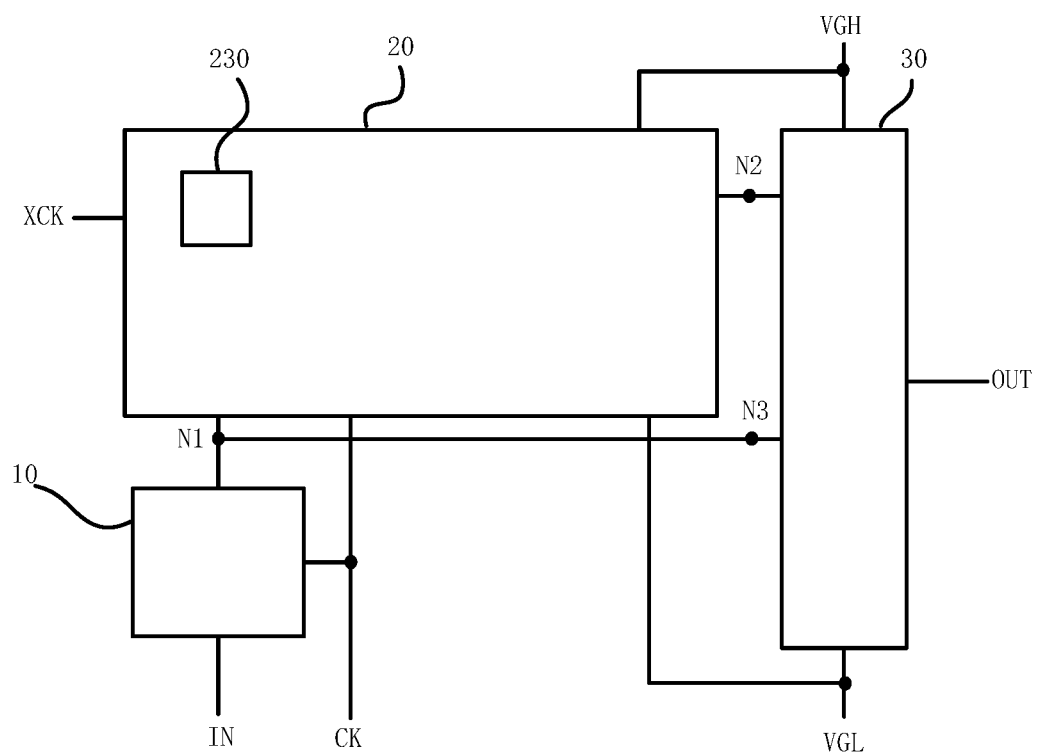
FIG. 5 illustrates a schematic frame-structure diagram of a shift register consistent with the disclosed embodiments of the present disclosure.

FIG. 4 illustrates a schematic structural diagram of a driving circuit consistent with the disclosed embodiments of the present disclosure. FIG. 5 illustrates a schematic frame-structure diagram of a shift register consistent with the disclosed embodiments of the present disclosure. With reference to FIG. 4 and FIG. 5, in one embodiment, the driving circuit 100 in the display panel may include N levels of shift registers 110 cascaded with each other, where N ≥ 2.

As shown in FIG. 5, the shift register 110 in the driving circuit 100 may include a first control unit 10, a second control unit 20 and a third control unit 30.

The first control unit 10 is configured to receive an input signal IN and control a signal of a first node N1 in response to a first clock signal CK.

The second control unit 20 is configured to receive a first voltage signal VGH and a second voltage signal VGL, and control a signal of the second node N2 in response to the signal of the first node N1, the first clock signal CK, and a second clock signal XCK.

The third control unit 30 is configured to receive the first voltage signal VGH and the second voltage signal VGL, and control an output signal OUT in response to the signal of the second node N2 and the signal of the third node N3. The third node N3 is connected to the first node N1. The first voltage signal VGH is a high-level signal, and the second voltage signal VGL is a low-level signal.

The second control unit 20 includes an adjustment unit 230. The adjustment unit 230 is configured to maintain the low-level signal of the first node N1, when the signal of the first node N1 and the signal of the third node N3 are each a low-level signal, and the second clock signal XCK is a low-level signal. Accordingly, the low-level signal of the third node N3 may be maintained, the stability of the output signal OUT generated by the third control unit 30 may be improved, and thus stability of the signal output by the driving circuit 100 may be improved.

Figure 6:
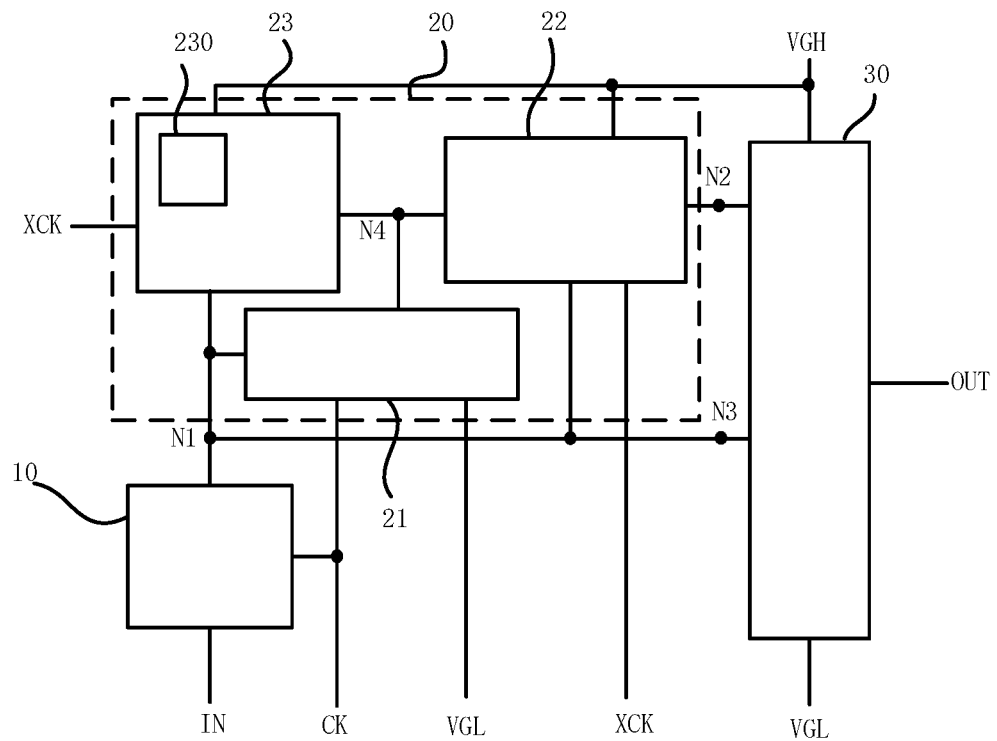
FIG. 6 illustrates a schematic frame-structure diagram of another shift register consistent with the disclosed embodiments of the present disclosure.

FIG. 6 illustrates a schematic frame-structure diagram of another shift register consistent with the disclosed embodiments of the present disclosure. With reference to FIG. 6, in some embodiments, the second control unit 20 may include a first sub-control unit 21, a second sub-control unit 22 and a third sub-control unit 23.

The first sub-control unit 21 is configured to at least receive the second voltage signal VGL, and control the signal of the fourth node N4 in response to the first clock signal CK and the signal of the first node N1.

The second sub-control unit 22 is configured to receive the first voltage signal VGH and the signal of the fourth node N4, and control the signal of the second node N2 in response to the second clock signal XCK and the signal of the first node N1.

The third sub-control unit 23 may be connected between the first voltage signal VGH and the first node N1, and the third sub-control unit 23 may include the adjustment unit 230.

Figure 7:
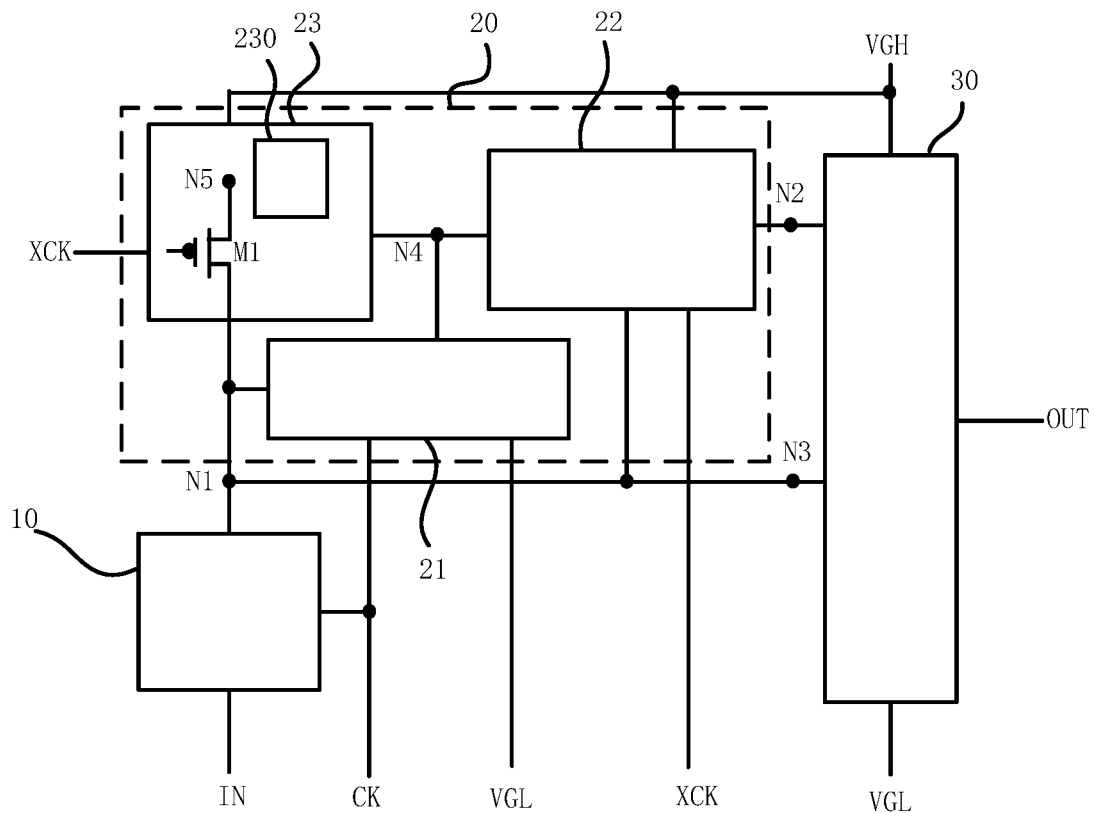
FIG. 7 illustrates a schematic frame-structure diagram of another shift register consistent with the disclosed embodiments of the present disclosure.

FIG. 7 illustrates a schematic frame-structure diagram of another shift register consistent with the disclosed embodiments of the present disclosure. With reference to FIG. 7, in some embodiments, the third sub-control unit 23 includes a first transistor M1. A source of the first transistor M1 is connected to a fifth node N5, and a drain of the first transistor M1 is connected to the first node N1. The fifth node N5 is coupled to the first voltage signal VGH. It may be understood that the fifth node N5 may be directly connected to the first voltage signal VGH. A transistor may also be disposed between the fifth node N5 and the first voltage signal VGH, and the fifth node N5 may be connected to the first voltage signal VGH through the transistor.

The adjustment unit 230 in the third sub-control unit 23 is configured to control the signal of the fifth node N5, or to control the turn-on and turn-off of the first transistor M1. Accordingly, when the signal of the first node N1 and the signal of the third node N3 are each a low-level signal, and the second clock signal XCK is a low-level signal, the low-level signal of the first node N1 may be maintained.

Figure 8:
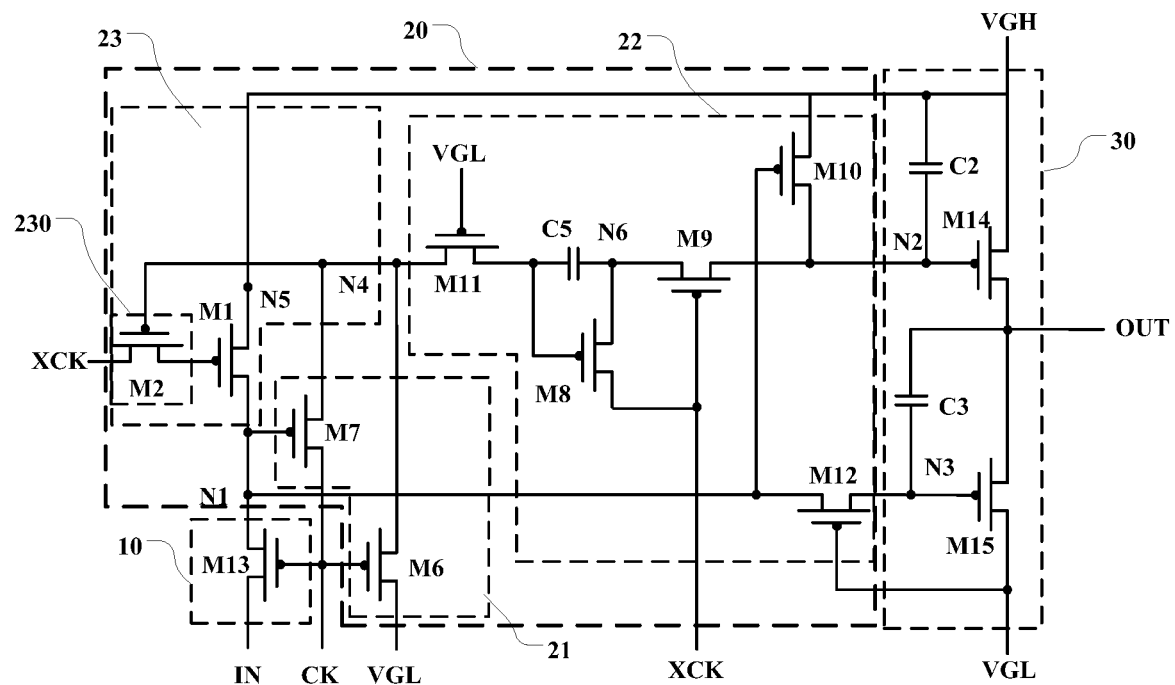
FIG. 8 illustrates a schematic circuit diagram of a shift register consistent with the disclosed embodiments of the present disclosure.

FIG. 8 illustrates a schematic circuit diagram of a shift register consistent with the disclosed embodiments of the present disclosure. With reference to FIG. 8, in some embodiments, the adjustment unit 230 is configured to control the first transistor M1 to remain turned-off when the signal of the first node N1 and the signal of the third node N3 are each a low-level signal, the first clock signal CK is a high-level signal, and the second clock signal XCK is a low-level signal. Accordingly, when the signal of the first node N1 and the signal of the third node N3 are each a low-level signal, and the second clock signal XCK is a low-level signal, the low-level signal of the first node N1 may be remained.

With continuous reference to FIG. 8, in some embodiments, when the signal of the first node N1 and the signal of the third node N3 are each a low-level signal, the first clock signal CK is a high-level signal, and the second clock signal XCK is a low-level signal, the signal of the fourth node N4 may be a high-level signal. The adjustment unit 230 is configured to receive the second clock signal XCK, control the gate potential of the first transistor M1 in response to the signal of the fourth node N4, and thus control the first transistor M1 to remain turned-off.

In some embodiments, the first transistor M1 is a PMOS transistor. When the gate of the first transistor M1 receives a high-level signal, the first transistor M1 remains turned-off. It should be noted that, in one embodiment, the first transistor M1 is exemplarily a PMOS transistor. In some other embodiments, the first transistor M1 may be an NMOS transistor, and when the gate of the first transistor M1 receives a low-level signal, the first transistor M1 may remain turned-off.

With continuous reference to FIG. 8, in some embodiments, the adjustment unit 230 includes a second transistor M2. A gate of the second transistor M2 is connected to the fourth node N4, a source of the second transistor M2 is configured to receive the second clock signal XCK, and the drain of the second transistor M2 is connected to the gate of the first transistor M1.

When the signal of the first node N1 and the signal of the third node N3 are each a low-level signal, the first clock signal CK is a high-level signal, and the second clock signal XCK is a low-level signal, the signal of the fourth node N4 is a high-level signal for controlling the second transistor M2 to be turned off. The low-level signal of the second clock signal XCK may not be transmitted to the gate of the first transistor M1, the gate of the first transistor M1 may maintain a high-level signal, thus controlling the first transistor M1 to remain turned-off.

With continuous reference to FIG. 8, in some embodiments, the fifth node N5 may be directly connected to the first voltage signal VGH. That is, the signal of the fifth node N5 may maintain the first voltage signal VGH for a long time. When the signal of the first node N1 and the signal of the third node N3 are each a low-level signal, the first clock signal CK is a high-level signal, and the second clock signal XCK is a low-level signal, the first node N1 is a low-level signal, controlling the first transistor M1 to remain turned-off. Accordingly, the first voltage signal VGH may be prevented from causing interference to the signal of the first node N1, and thus the first node N1 may maintain a low-level signal.

Figure 9:
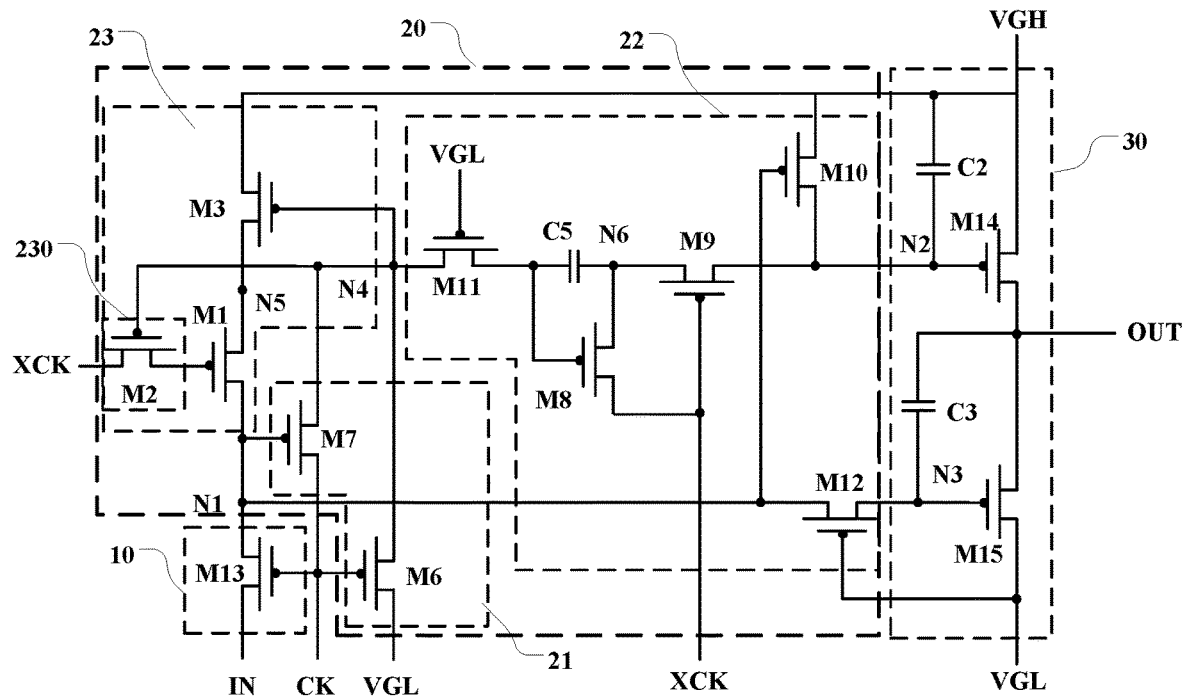
FIG. 9 illustrates a schematic circuit diagram of another shift register consistent with the disclosed embodiments of the present disclosure.

FIG. 9 illustrates a schematic circuit diagram of another shift register consistent with the disclosed embodiments of the present disclosure. With reference to FIG. 9, in some embodiments, the third sub-control module 23 may include a third transistor M3. A source of the third transistor M3 is connected to the first voltage signal VGH, a drain of the third transistor M3 is connected to the fifth node N5, and a gate of the third transistor M3 is coupled to the fourth node N4. When the signal of the fourth node N4 is a low-level signal, the third transistor M3 is turned on, and the first voltage signal VGH is transmitted to the fifth node N5.

When the signal of the first node N1 and the signal of the third node N3 are each a low-level signal, the first clock signal CK is a high-level signal, and the second clock signal XCK is a low-level signal, the first node N1 is a low-level signal. The signal of the fifth node N5 is the first voltage signal VGH, controlling the first transistor M1 to remain turned-off. Accordingly, the first voltage signal VGH may be prevented from causing interference to the signal of the first node N1, and thus the first node N1 may maintain a low-level signal.

Figure 10:
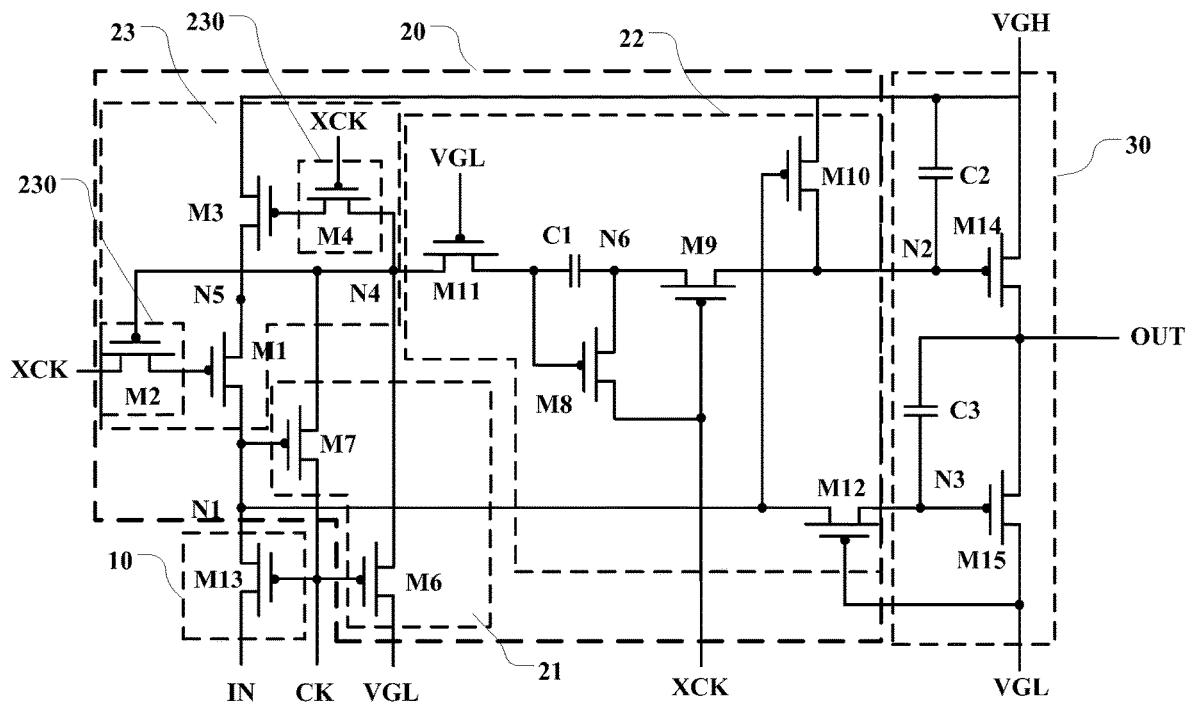
FIG. 10 illustrates a schematic circuit diagram of another shift register consistent with the disclosed embodiments of the present disclosure.

FIG. 10 illustrates a schematic circuit diagram of another shift register consistent with the disclosed embodiments of the present disclosure. With reference to FIG. 10, in some embodiments, the third sub-control module 23 includes a fourth transistor M4. A source of the fourth transistor M4 is connected to the fourth node N4, a gate of the fourth transistor M4 is connected to the second clock signal XCK, and a drain of the fourth transistor M4 is connected to the gate of the third transistor M3. When the second clock signal XCK is a high-level signal, the fourth transistor M4 is turned off. The low-level signal of the fourth node N4 may not be transmitted to the third transistor M3, and the third transistor M3 is turned off. Accordingly, the first voltage signal VGH may not be transmitted to the fifth node N5.

When the signal at the first node N1 and the signal at the third node N3 are each a low-level signal, the first clock signal CK is a high-level signal, and the second clock signal XCK is a low-level signal, the first node N1 is a low-level signal for controlling the first transistor M1 to remain turned-off. Further, the first voltage signal VGH may be prevented from causing interference to the signal of the first node N1 through the fifth node N5, and thus the first node N1 may maintain a low-level signal.

Figure 11:
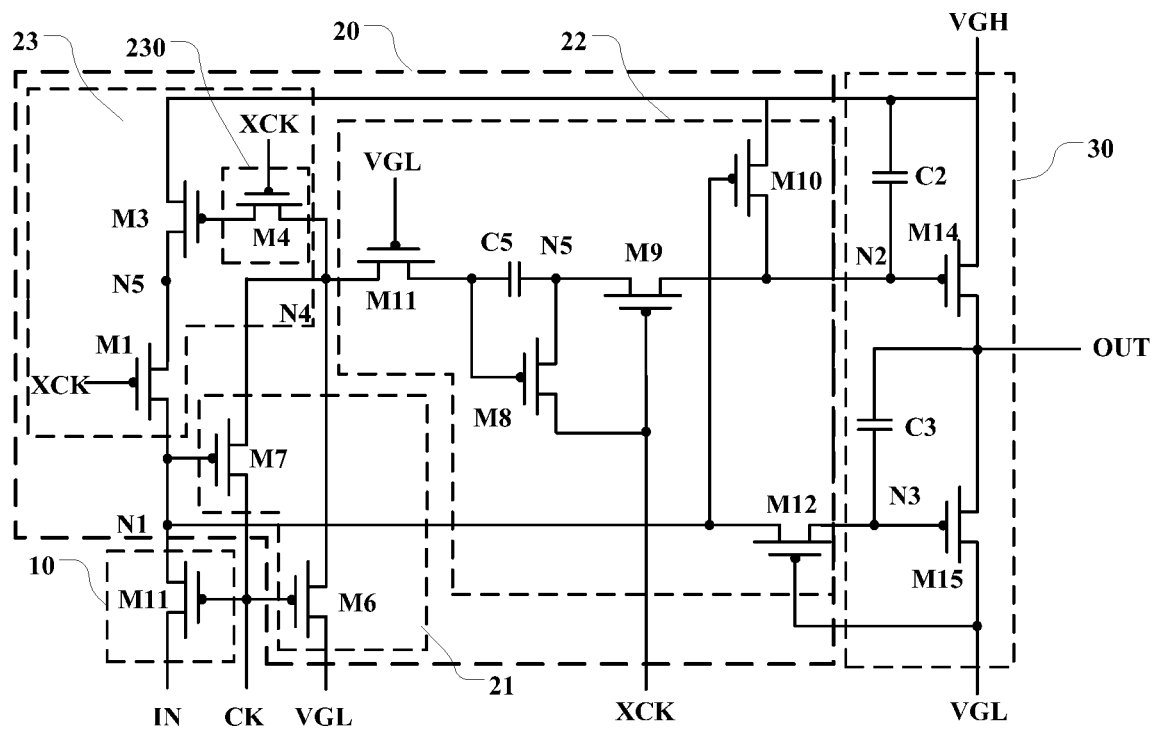
FIG. 11 illustrates a schematic circuit diagram of another shift register consistent with the disclosed embodiments of the present disclosure.

FIG. 11 illustrates a schematic circuit diagram of another shift register consistent with the disclosed embodiments of the present disclosure. With reference to FIG. 11, in some embodiments, the adjustment unit 230 is configured to control the fifth node N5 to be disconnected from the first voltage signal VGH, when the signal of the first node N1 and the signal of the third node N3 are each a low-level signal, the first clock signal CK is a low-level signal, and the second clock signal XCK is a high-level signal. Accordingly, the first voltage signal VGH may not be transmitted to the fifth node N5.

As such, when the signal at the first node N1 and the signal at the third node N3 are each a low-level signal, the first clock signal CK is a high-level signal, and the second clock signal XCK is a low-level signal, the first node N1 is a low-level signal. Accordingly, the first voltage signal VGH may be prevented from causing interference to the signal of the first node N1 through the fifth node N5, and thus the first node N1 may maintain a low-level signal.

With continuous reference to FIG. 11, in some embodiments, the third sub-control module 23 may include a third transistor M3. A source of the third transistor M3 is connected to the first voltage signal VGH, a drain of the third transistor M3 is connected to the fifth node N5, and a gate of the third transistor M3 is coupled to the adjustment unit 230. The adjustment unit 230 is configured to receive the signal of the fourth node N4 and control the gate potential of the third transistor M3 in response to the second clock signal XCK.

When the signal of the first node N1 and the signal of the third node N3 are each a low-level signal, the first clock signal CK is a low-level signal, and the second clock signal XCK is a high-level signal, the adjustment unit 230 may be turned off, and the low-level signal of the fourth node N4 may not be transmitted to the gate of the third transistor M3. Accordingly, the third transistor M3 may be turned off, and the first voltage signal VGH may not be transmitted to the fifth node N5.

As such, when the signal of the first node N1 and the signal of the third node N3 are each a low-level signal, the first clock signal CK is a high-level signal, and the second clock signal XCK is a low-level signal, the first node N1 may be a low-level signal, and the high level of the fourth node N4 may be transmitted to the gate of the third transistor M3. Accordingly, the third transistor M3 may be controlled to be turned off, and the first voltage signal VGH may be prevented from causing interference to the signal of the first node N1 through the fifth node N5, and thus the first node N1 may maintain a low-level signal.

With continuous reference to FIG. 11, in some embodiments, the adjustment unit 230 may include a fourth transistor M4. A source of the fourth transistor M4 is connected to the fourth node N4, a gate of the fourth transistor M4 is connected to the second clock signal XCK, and a drain of the fourth transistor M4 is connected to the gate of the third transistor M3.

When the signal of the first node N1 and the signal of the third node N3 are each a low-level signal, the first clock signal CK is a low-level signal, and the second clock signal XCK is a high-level signal, the fourth transistor M4 may be turned off, and the low-level signal of the fourth node N4 may not be transmitted to the gate of the third transistor M3. Accordingly, the third transistor M3 may be turned off, and the first voltage signal VGH may not be transmitted to the fifth node N5.

As such, when the signal of the first node N1 and the signal of the third node N3 are each a low-level signal, the first clock signal CK is a high-level signal, and the second clock signal XCK is a low-level signal, the first node N1 may be a low-level signal, and the fourth transistor M4 may be turned on. The high level of the fourth node N4 may be transmitted to the gate of the third transistor M3, thus controlling the third transistor M3 to be turned off. Accordingly, the interference of the first voltage signal VGH to the signal of the first node N1 through the fifth node N5 may be avoided, and thus the first node N1 may maintain a low-level signal.

With continuous reference to FIG. 11, the third transistor M3 and the fourth transistor M4 may each be a PMOS transistor. It should be noted that in some other embodiments, the third transistor M3 and the fourth transistor M4 may also be NMOS transistors, and corresponding control signals may also change accordingly.

Figure 12:
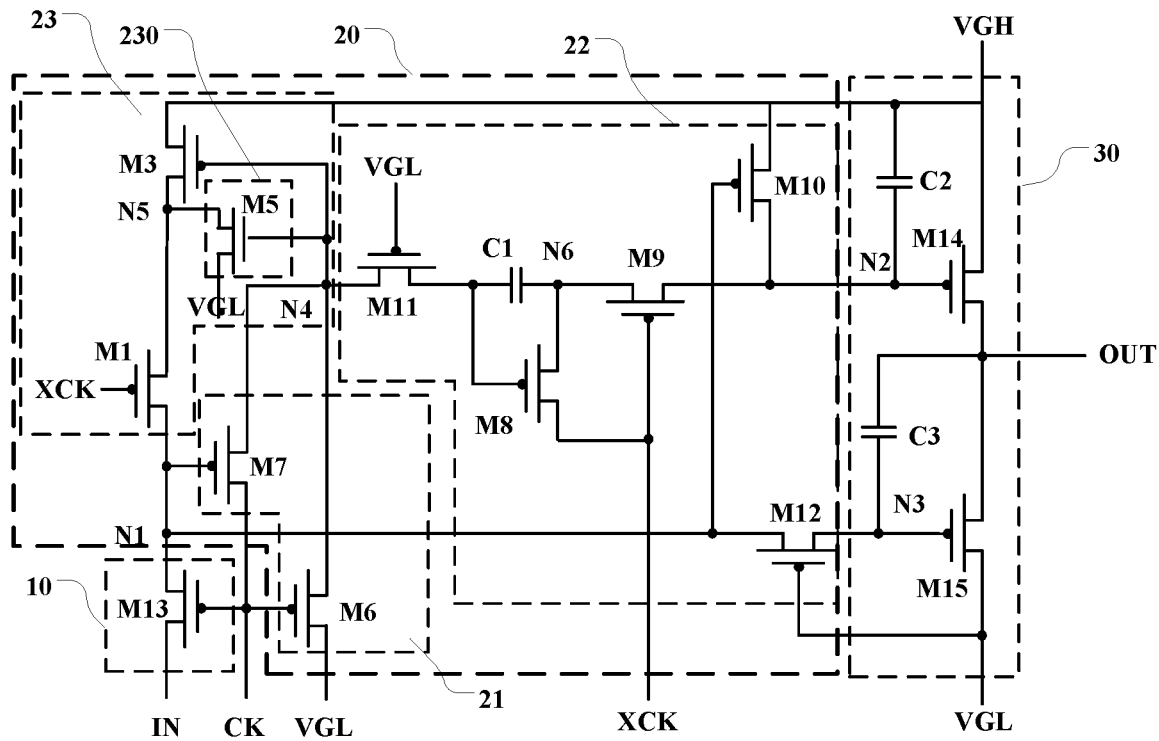
FIG. 12 illustrates a schematic circuit diagram of another shift register consistent with the disclosed embodiments of the present disclosure.

FIG. 12 illustrates a schematic circuit diagram of another shift register consistent with the disclosed embodiments of the present disclosure. With reference to FIG. 12, in some embodiments, the adjustment unit 230 is configured to control the signal of the fifth node N5 to be a low-level signal when the signal of the first node N1 and the signal of the third node N3 are each a low-level signal, and the first clock signal CK is a high-level signal.

As such, when the signal of the first node N1 and the signal of the third node N3 are each a low-level signal, the first clock signal CK is a high-level signal, and the second clock signal XCK is a low-level signal, the first node N1 may have a low-level signal. Accordingly, interference of the fifth node N5 to the signal of the first node N1 when the fifth node N5 has a high-level signal may be avoided, and thus the first node N1 may maintain a low-level signal.

With continuous reference to FIG. 12, in some embodiments, the third sub-control module 23 may include a third transistor M3. A source of the third transistor M3 is connected to the first voltage signal VGH, a drain of the third transistor M3 is connected to the fifth node N5, and a gate of the third transistor M3 is coupled to the fourth node N4. The adjustment unit 230 is configured to receive the second voltage signal VGL, and control the signal of the fifth node N5 in response to the signal of the fourth node N4.

As such, when the signal of the first node N1 and the signal of the third node N3 are each a low-level signal, the first clock signal CK is a high-level signal, and the second clock signal XCK is a low-level signal, the first node N1 may have a low-level signal, and the fourth node N4 may be at a high level. The adjustment unit 230 controls the signal of the fifth node N5 to be a low-level signal, and the high potential of the fourth node N4 is transmitted to the gate of the third transistor M3, controlling the third transistor M3 to be turned off. Accordingly, the first voltage signal VGH may be prevented from being transmitted to the fifth node N5, such that the fifth node N5 may maintain a low-level signal, and the first node N1 may maintain a low-level signal.

The turn-off and turn-on of the adjustment unit 230 may be controlled by the signal of the fourth node N4. In some embodiments, when the signal of the fourth node N4 is a high-level signal, the adjustment unit 230 is turned on, and when the signal of the fourth node N4 is a low-level signal, the adjustment unit 230 is turned off.

With continuous reference to FIG. 12, in some embodiments, the adjustment unit 230 may include a fifth transistor M5. A source of the fifth transistor M5 is connected to the second voltage signal VGL, a drain of the fifth transistor M5 is connected to the fifth node N5, and a gate of the fifth transistor M5 is connected to the fourth node N4.

When the signal of the first node N1 and the signal of the third node N3 are each a low-level signal, the first clock signal CK is a high-level signal, and the second clock signal XCK is a low-level signal, the first node N1 has a low-level signal, the fourth node N4 is at a high level, and the fifth transistor M5 is turned on. The second voltage signal VGL is transmitted to the fifth node N5, and the high potential of the fourth node N4 is transmitted to the gate of the third transistor M3. The third transistor M3 is controlled to be turned off, such that the first voltage signal VGH may be prevented from being transmitted to the fifth node N5. Accordingly, the fifth node N5 may maintain the second voltage signal VGL, such that the fifth node N5 may not raise the signal of the first node N1, and thus the first node N1 may maintain a low-level signal.

In some embodiments, the first transistor M1 and the third transistor M3 are each a PMOS transistor, and the fifth transistor M5 is an NMOS transistor.

It should be noted that in some other embodiments, the first transistor M1, the third transistor M3, and the fifth transistor M5 may also be other transistors. Correspondingly, the control signals of the third transistor M1, the third transistor M3, and the fifth transistor M5 may also change accordingly.

Based on any one of the embodiments shown in FIGS. 8 to 12, in one embodiment, the first sub-control unit 21 may include a sixth transistor M6 and a seventh transistor M7.

A source of the sixth transistor M6 is connected to the second voltage signal VGL, a drain of the sixth transistor M6 is connected to the fourth node N4, and a gate of the sixth transistor M6 is connected to the first clock signal CK. A source of the seventh transistor M7 is connected to the first clock signal CK, a drain of the seventh transistor M7 is connected to the fourth node N4, and a gate of the seventh transistor M7 is connected to the first node N1.

The second sub-control unit 22 includes an eighth transistor M8, a ninth transistor M9, a tenth transistor M10, and a first capacitor C1.

A source of the eighth transistor M8 is connected to the second clock signal XCK, a drain of the eighth transistor M8 is connected to the sixth node N6, and a gate of the eighth transistor M8 is connected to the fourth node N4. A source of the ninth transistor M9 is connected to the sixth node N6, a drain of the ninth transistor M9 is connected to the second node N2, and a gate of the ninth transistor M9 is connected to the second clock signal XCK. A source of the tenth transistor M10 is connected to the first voltage signal VGH, a drain of the tenth transistor M10 is connected to the second node N2, and a gate of the tenth transistor M10 is connected to the first node N1. A first electrode plate of the first capacitor C1 is connected to the fourth node N4, and a second electrode plate of the first capacitor C1 is connected to the fifth node N5.

Based on any one of the foregoing embodiments shown in FIGS. 8 to 12, in one embodiment, the second sub-control unit 22 may further includes an eleventh transistor M11 and a twelfth transistor M12.

A source of the eleventh transistor M11 is connected to the fourth node N4, a drain of the eleventh transistor M11 is connected to the gate of the eighth transistor M8, and a gate of the eleventh transistor M11 is connected to the second voltage signal VGL. A source of the twelfth transistor M12 is connected to the first node N1, a drain of the twelfth transistor M12 is connected to the third node N3, and a gate of the twelfth transistor M12 is connected to the second voltage signal VGL.

Based on any one of the foregoing embodiments shown in FIGS. 8 to 12, in one embodiment, the first control unit 10 may include a thirteenth transistor M13. A source of the thirteenth transistor M13 is connected to the input signal IN, a drain of the thirteenth transistor M13 is connected to the first node N1, and a gate of the thirteenth transistor M13 is connected to the first clock signal CK.

The third control unit 30 may include a fourteenth transistor M14, a fifteenth transistor M15, a second capacitor C2, and a third capacitor C3.

A source of the fourteenth transistor M14 is connected to the first voltage signal VGH, a drain of the fourteenth transistor M14 is connected to the output signal OUT, and a gate of the fourteenth transistor M14 is connected to the second node N2. A source of the fifteenth transistor M15 is connected to the second voltage signal VGL, a drain of the fifteenth transistor M15 is connected to the output signal OUT, and a gate of the fifteenth transistor M15 is connected to the third node N3. A first plate of the second capacitor C2 is connected to the first voltage signal VGH, and a second plate of the second capacitor C2 is connected to the second node N2. A first electrode plate of the third capacitor C3 is connected to the third node N3, and a second electrode plate of the third capacitor C3 is connected to the second voltage signal VGH or the output signal OUT.

A working process of a shift register provided by the present disclosure is described below in conjunction with a timing diagram of each signal in the shift register.

Figure 13:
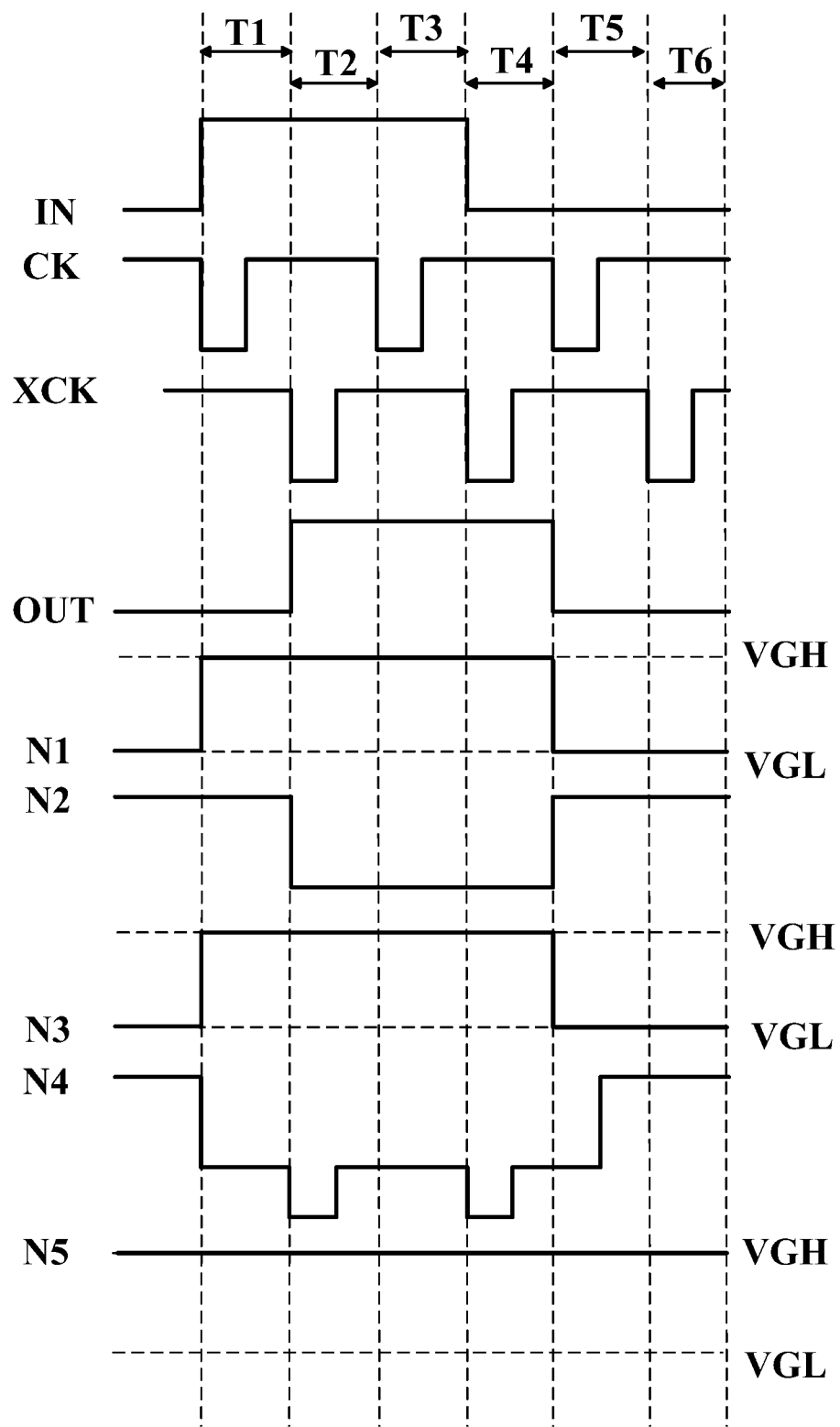
FIG. 13 illustrates a driving timing diagram of a shift register consistent with the disclosed embodiments of the present disclosure.

FIG. 13 illustrates a driving timing diagram of a shift register consistent with the disclosed embodiments of the present disclosure. FIG. 13 may be referred to in combination with FIG. 8.

During the period T1, the input signal IN is at a high level, the first clock signal CK is at a low level, the thirteenth transistor M13 is turned on, and the input signal IN is transmitted to the first node N1, such that the first node N1 is at a high level. The twelfth transistor M12 is turned on, the potential of the first node N1 is transmitted to the third node N3, and the third node N3 is at a high level. The sixth transistor M6 is turned on, the second voltage signal VGL is transmitted to the fourth node N4, and the fourth node N4 is at a low level. The fifth node N5 is at a high level. The second transistor M2 is turned on, the second clock signal XCK is at a high level, the signal of the second clock signal XCK is transmitted to the gate of the first transistor M1, and the first transistor M1 is turned off. The third node N3 is at a high level, the fifteenth transistor M15 is turned off, the second node N2 remains at a high level, the fourteenth transistor M14 is turned off, and the output signal OUT keeps outputting a low level.

During the period T2, the input signal IN is at a high level, the first clock signal CK is at a high level, the thirteenth transistor M13 is turned off, and the first node N1 remains at a high level. The twelfth transistor M12 is turned on, the potential of the first node N1 is transmitted to the third node N3, and the third node N3 remains at a high level. The sixth transistor M6 is turned off, and the fourth node N4 remains at a low level. The fifth node N5 is at a high level. The second transistor M2 is turned on, the second clock signal XCK is at a low level, the signal of the second clock signal XCK is transmitted to the gate of the first transistor M1, and the first transistor M1 is turned on. The third node N3 is at a high level, the fifteenth transistor M15 is turned off, the second clock signal XCK is at a low level, and the second node N2 becomes to be at a low level. The fourteenth transistor M14 is turned on, the first voltage signal VGH is transmitted to the output signal OUT, and the output signal OUT outputs a high level.

In the period T3, the input signal IN is at a high level, the first clock signal CK is at a low level, the thirteenth transistor M13 is turned on, and the input signal IN is transmitted to the first node N1, such that the first node N1 is at a high level. The twelfth transistor M12 is turned on, the potential of the first node N1 is transmitted to the third node N3, and the third node N3 is at a high level. The sixth transistor M6 is turned on, the second voltage signal VGL is transmitted to the fourth node N4, and the fourth node N4 is at a low level. The fifth node N5 is at a high level. The second transistor M2 is turned on, the second clock signal XCK is at a high level, the signal of the second clock signal XCK is transmitted to the gate of the first transistor M1, and the first transistor M1 is turned off. The third node N3 is at a high level, the fifteenth transistor M15 is turned off, and the second node N2 is remains at a low level. The fourteenth transistor M14 is turned on, the first voltage signal VGH is transmitted to the output signal OUT, and the output signal OUT outputs a high level.

In the period T4, the input signal IN is at a low level, the first clock signal CK is at a high level, the thirteenth transistor M13 is turned off, and the first node N1 remains at a high level. The twelfth transistor M12 is turned on, the potential of the first node N1 is transmitted to the third node N3, and the third node N3 remains at a high level. The sixth transistor M6 is turned off, and the fourth node N4 remains at a low level. The fifth node N5 is at a high level. The second transistor M2 is turned on, the second clock signal XCK is at a low level, the signal of the second clock signal XCK is transmitted to the gate of the first transistor M1, and the first transistor M1 is turned on. The third node N3 is at a high level, the fifteenth transistor M15 is turned off, the second clock signal XCK is at a low level, and the second node N2 remains at a low level. The fourteenth transistor M14 is turned on, the first voltage signal VGH is transmitted to the output signal OUT, and the output signal OUT outputs a high level.

In the period T5, the input signal IN is at a low level, the first clock signal CK is at a low level, the thirteenth transistor M13 is turned on, and the input signal IN is transmitted to the first node N1, such that the first node N1 is at a low level. The twelfth transistor M12 is turned on, the potential of the first node N1 is transmitted to the third node N3, and the third node N3 is at a low level. The sixth transistor M6 is turned on, the second voltage signal VGL is transmitted to the fourth node N4, and the fourth node N4 is at a low level. The fifth node N5 is at a high level. The second transistor M2 is turned on, the second clock signal XCK is at a high level, the signal of the second clock signal XCK is transmitted to the gate of the first transistor M1, and the first transistor M1 is turned off. The second node N2 is at a high level, and the fourteenth transistor M14 is turned off. The third node N3 is at a low level, and the fifteenth transistor M15 is turned on. The second voltage signal VGL is transmitted to the output signal OUT, and the output signal OUT outputs a low level.

In the period T6, the input signal IN is at a low level, the first clock signal CK is at a high level, the thirteenth transistor M13 is turned off, and the first node N1 remains at a low level. The twelfth transistor M12 is turned on, the potential of the first node N1 is transmitted to the third node N3, and the third node N3 remains at a low level. The fifth node N5 is at a high level. The sixth transistor M6 is turned off, the tenth transistor M10 is turned on, the eleventh transistor M11 is turned on, and the second clock signal XCK is at a low level. The ninth transistor M9 is turned on, the first voltage signal VGH is transmitted to the fourth node N4, and the fourth node N4 is at a high level. The second transistor M2 is turned off, and the first transistor M1 remains turned off. The second clock signal XCK is at a low level, the second node N2 remains at a high level. The fourteenth transistor M14 is turned off, the third node N3 is at a low level, and the fifteenth transistor M15 is turned on. The second voltage signal VGL is transmitted to the output signal OUT, and the output signal OUT outputs a low level.

Only when the fourth node N4 and the second clock signal XCK are each at a low level, the first transistor M1 is in a conducting state. Accordingly, in the period T5 and in the period T6, the first transistor M1 is in a turned-off state. Thus, in the period T6, the high-level signal of the fifth node N5 may be prevented from affecting the low-level signal of the first node N1. Accordingly, the low-level signal of the first node N1 may be remained. As such, the low-level signal of the third node N3 may be remained, and the stability of the output signal OUT generated by the third control unit 30 may be improved, and thus the stability of the output signal of the driving circuit 100 may be improved.

In the shift register described in FIG. 9, a third transistor M3 is added. But, during the period T1 to period T6, the levels of the first node N1, the second node N2, the third node N3, the fourth node N4, the fifth node N5, and the output signal OUT are same as the above process. That is, the timing diagram of the signal of each node in the shift register shown in FIG. 9 is also shown in FIG. 13.

Accordingly, in the shift register shown in FIG. 9, only when the fourth node N4 and the second clock signal XCK are each at a low level, the first transistor M1 is in a conducting state. Accordingly, in the period T5 and in the period T6, the first transistor M1 is in a turned-off state, and thus, in the period T6, the high-level signal of the fifth node N5 may be prevented from affecting the low-level signal of the first node N1. As such, the low-level signal of the first node N1 may be remained, and thus the low-level signal of the third node N3 may be remained. Accordingly, the stability of the output signal OUT generated by the third control unit 30 may be improved, and thus the stability of the output signal of the driving circuit 100 may be improved.

In the shift register described in FIG. 10, a third transistor M3 and a fourth transistor M4 are added. But, during the period T1 to period T6, the levels of the first node N1, the second node N2, the third node N3, the fourth node N4, the fifth node N5, and the output signal OUT are same as the above process. That is, the timing diagram of the signal of each node in the shift register shown in FIG. 10 is also shown in FIG. 13.

In the shift register shown in FIG. 10, during the period T5, the second clock signal XCK is a high-level signal, the fourth transistor M4 is turned off, the low-level signal of the fourth node N4 may not be transmitted to the third transistor M3, and the three transistor M3 is turned off. Accordingly, the first voltage signal VGH may not be transmitted to the fifth node N5. In the period T6, the second clock signal XCK is at a low level, and the fourth transistor M4 is turned on. The high-level signal of the fourth node N4 is transmitted to the gate of the third transistor M3, the third transistor M3 is turned off, and the first voltage signal VGH may not be transmitted to the fifth node N5. That is, in the period T5 and in the period T6, the fifth node N5 is at a floating state, and is no longer charged with the first voltage signal VGH. Accordingly, the influence of the fifth node N5 on the first node N1 may be reduced, the low-level signal of the first node N1 may be remained, and the low-level signal of the third node N3 may thus be remained. As such, the stability of the output signal OUT generated by the third control unit 30 may be increased, and thus the stability of the output signal of the driving circuit 100 may be improved.

Further, only when the fourth node N4 and the second clock signal XCK are each at a low level, the first transistor M1 is in the conducting state. Accordingly, in the period T5 and in the period T6, the first transistor M1 is in a turned-off state. Thus, in the period T6, the high-level signal of the fifth node N5 may be prevented from affecting the low-level signal of the first node N1. As such, the low-level signal of the first node N1 may be remained, and thus the low-level signal of the third node N3 may be remained. Accordingly, the stability of the output signal OUT generated by the third control unit 30 may be improved, and thus the stability of the output signal of the driving circuit 100 may be improved.

Figure 14:
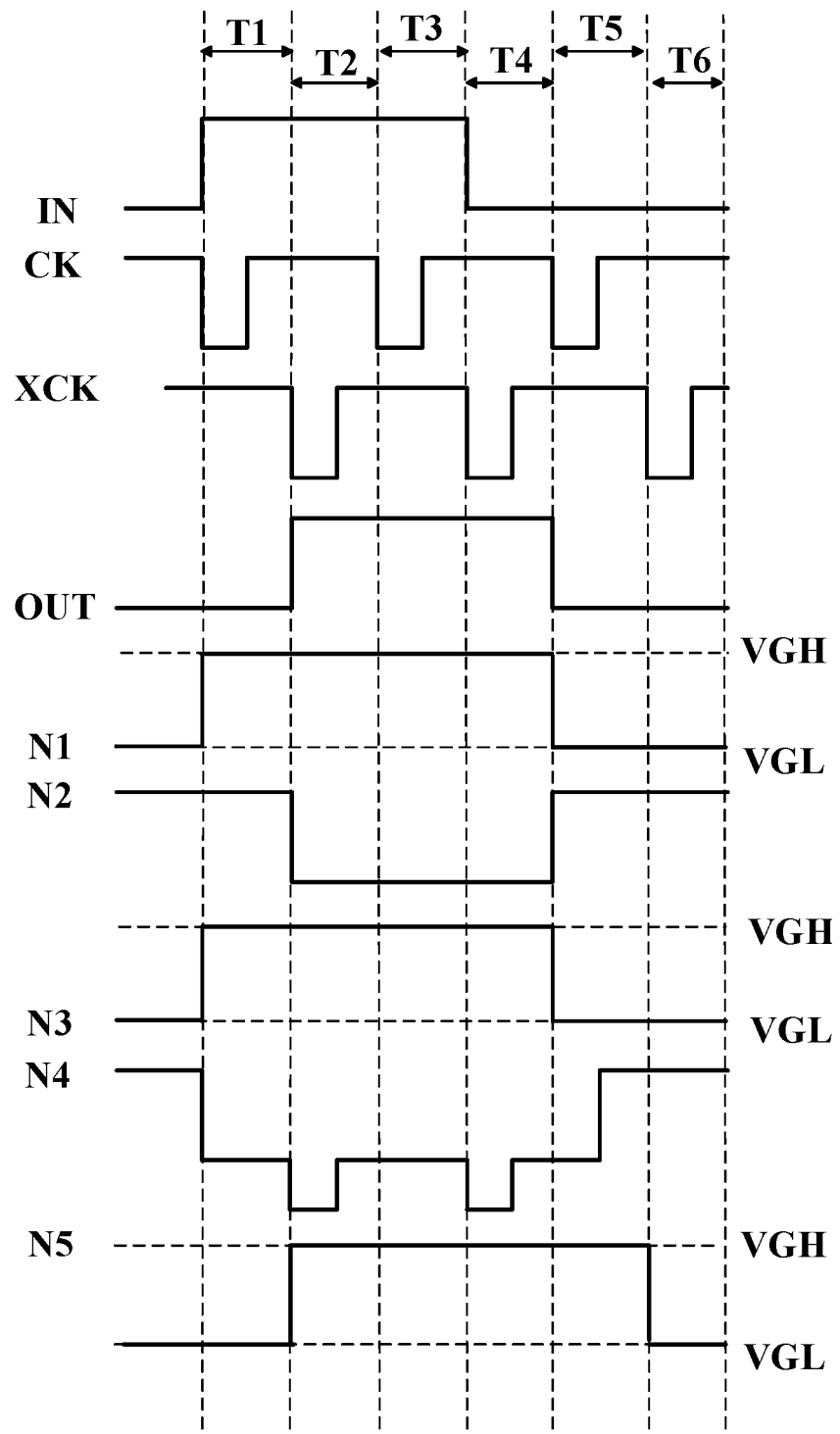
FIG. 14 illustrates another driving timing diagram of a shift register consistent with the disclosed embodiments of the present disclosure.

FIG. 14 illustrates another driving timing diagram of a shift register consistent with the disclosed embodiments of the present disclosure. FIG. 14 may be referred to in combination with FIG. 11.

During the period T1, the input signal IN is at a high level, the first clock signal CK is at a low level, the thirteenth transistor M13 is turned on, and the input signal IN is transmitted to the first node N1, such that the first node N1 is at a high level. The twelfth transistor M12 is turned on, the potential of the first node N1 is transmitted to the third node N3, and the third node N3 is at a high level. The sixth transistor M6 is turned on, the second voltage signal VGL is transmitted to the fourth node N4, and the fourth node N4 is at a low level. The second clock signal XCK is at a high level, the fourth transistor M4 is turned off, the first transistor M1 is turned off, and the fifth node N5 is at a low level. The third node N3 is at a high level, the fifteenth transistor M15 is turned off, the second node N2 remains at a high level, the fourteenth transistor M14 is turned off, and the output signal OUT remains at a low level.

During the period T2, the input signal IN is at a high level, the first clock signal CK is at a high level, the thirteenth transistor M13 is turned off, and the first node N1 remains at a high level. The twelfth transistor M12 is turned on, the first potential of the node N1 is transmitted to the third node N3, and the third node N3 remains at a high level. The sixth transistor M6 is turned off, and the fourth node N4 remains at a low level. The second clock signal XCK is at a low level, the fourth transistor M4 is turned on, the first transistor M1 is turned on, and the fifth node N5 is at a high level. The third node N3 is at a high level, the fifteenth transistor M15 is turned off, the second node N2 becomes to be at a low level, and the fourteenth transistor M14 is turned on. The first voltage signal VGH is transmitted to the output signal OUT, and the output signal OUT outputs a high level.

In the period T3, the input signal IN is at a high level, the first clock signal CK is at a low level, the thirteenth transistor M13 is turned on, and the input signal IN is transmitted to the first node N1, such that the first node N1 is at a high level. The twelfth transistor M12 is turned on, the potential of the first node N1 is transmitted to the third node N3, and the third node N3 is at a high level. The sixth transistor M6 is turned on, the second voltage signal VGL is transmitted to the fourth node N4, and the fourth node N4 is at a low level. The second clock signal XCK is at a high level, the fourth transistor M4 is turned off, the first transistor M1 is turned off, and the fifth node N5 remains at a high level. The third node N3 is at a high level, the fifteenth transistor M15 is turned off, the second node N2 becomes a low level, and the fourteenth transistor M14 is turned on. The first voltage signal VGH is transmitted to the output signal OUT, and the output signal OUT outputs a high level.

In the period T4, the input signal IN is at a low level, the first clock signal CK is at a high level, the thirteenth transistor M13 is turned off, and the first node N1 remains at a high level. The twelfth transistor M12 is turned on, the potential of the first node N1 is transmitted to the third node N3, and the third node N3 remains at a high level. The sixth transistor M6 is turned off, and the fourth node N4 remains at a low level. The second clock signal XCK is at a low level, the fourth transistor M4 is turned on, the first transistor M1 is turned on, the third transistor M3 is turned on, the fifth transistor M3 is turned on, and the node N5 is at a high level. The third node N3 is at a high level, the fifteenth transistor M15 is turned off, and the clock signal XCK is at a low level. The second node N2 maintains at a low level, the fourteenth transistor M14 is turned on. The first voltage signal VGH is transmitted to the output signal OUT, and the output signal OUT outputs a high level.

In the period T5, the input signal IN is at a low level, the first clock signal CK is at a low level, the thirteenth transistor M13 is turned on, and the input signal IN is transmitted to the first node N1, such that the first node N1 is at a low level. The twelfth transistor M12 is turned on, the potential of the first node N1 is transmitted to the third node N3, and the third node N3 is at a low level. The sixth transistor M6 is turned on, the second voltage signal VGL is transmitted to the fourth node N4, and the fourth node N4 is at a low level. The second clock signal XCK is at a high level, the fourth transistor M4 is turned off, the first transistor M1 is turned off, and the fifth node N5 remains at a high level. The second node N2 is at a high level, and the fourteenth transistor M14 is turned off. The third node N3 is at a low level, the fifteenth transistor M15 is turned on. The second voltage signal VGL is transmitted to the output signal OUT, and the output signal OUT outputs a low level.

In the period T6, the input signal IN is at a low level, the first clock signal CK is at a high level, the thirteenth transistor M13 is turned off, and the first node N1 remains at a low level. The twelfth transistor M12 is turned on, the potential of the first node N1 is transmitted to the third node N3, and the third node N3 remains at a low level. The sixth transistor M6 is turned off, the tenth transistor M10 is turned on, the eleventh transistor M11 is turned on, and the second clock signal XCK is at a low level. The ninth transistor M9 is turned on, the first voltage signal VGH is transmitted to the fourth node N4, and the fourth node N4 is at a high level. The second clock signal XCK is at a low level, the fourth transistor M4 is turned on, and the first transistor M1 is turned on. The signal of the fourth node N4 is transmitted to the gate of the third transistor M3, the third transistor M3 is turned off, and the fifth node N5 is at a floating state. The second node N2 remains at a high level, the fourteenth transistor M14 is turned off, the third node N3 is at a low level, and the fifteenth transistor M15 is turned on. The second voltage signal VGL is transmitted to the output signal OUT, and the output signal OUT outputs a low level.

In a shift register described in FIG. 11, the third transistor M3 is turned on only in the period T2 and period T4. At this time, the first transistor M1 is also in a conducting state the first node N1 is at a high level, and the fifth node N5 is at a high level. Accordingly, the high level of the first node N1 may be stabilized.

During the period T5, the second clock signal XCK is a high-level signal, the fourth transistor M4 is turned off, the low-level signal of the fourth node N4 may not be transmitted to the third transistor M3, and the third transistor M3 is turned off. Accordingly, the first voltage signal VGH may not be transmitted to the fifth node N5, and the first node N1 is charged with the second voltage signal VGL. In the period T6, the second clock signal XCK is at a low level, the fourth transistor M4 is turned on, the high-level signal of the fourth node N4 is transmitted to the gate of the third transistor M3, and the third transistor M3 is turned off. The first voltage signal VGH may not be transmitted to the fifth node N5. The fifth node N5 is at a floating state, and is no longer charged with the first voltage signal VGH. Thus, the rise of the signal of the first node N1 by the signal of the fifth node N5 may be substantially eliminated, and the low-level signal of the first node N1 may be remained. Accordingly, the low-level signal of the third node N3 may be remained, the stability of the output signal OUT generated by the third control unit 30 may be improved, and thus the stability of the signal output by the driving circuit 100 may be improved.

Figure 15:
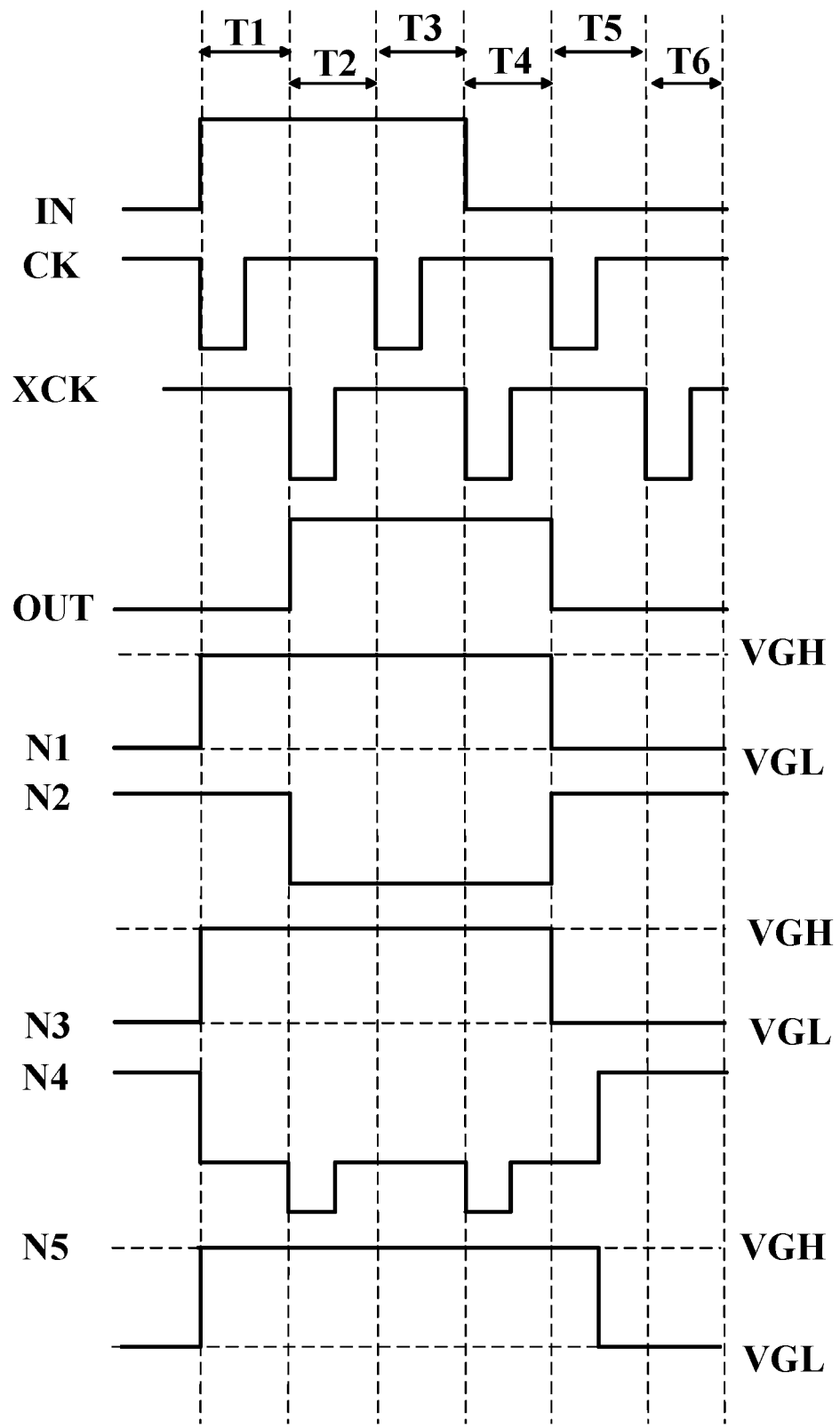
FIG. 15 illustrates another driving timing diagram of a shift register consistent with the disclosed embodiments of the present disclosure.

FIG. 15 illustrates another driving timing diagram of a shift register consistent with the disclosed embodiments of the present disclosure. FIG. 15 may be referred to in combination with FIG. 12.

In the period T1, the input signal IN is at a high level, the first clock signal CK is at a low level, the thirteenth transistor M13 is turned on, and the input signal IN is transmitted to the first node N1, such that the first node N1 is at a high level. The twelfth transistor M12 is turned on, the potential of the first node N1 is transmitted to the third node N3, and the third node N3 is at a high level. The sixth transistor M6 is turned on, the second voltage signal VGL is transmitted to the fourth node N4, the fourth node N4 is at a low level, the fifth transistor M5 is turned off, and the third transistor M3 is turned on. The first voltage signal VGH is transmitted to the fifth node N5, and the fifth node N5 is at a high level. The second clock signal XCK is at a high level, and the first transistor M1 is turned off. The third node N3 is at a high level, the fifteenth transistor M15 is turned off, the second node N2 remains at a high level, the fourteenth transistor M14 is turned off, and the output signal OUT remains at a low level.

During the period T2, the input signal IN is at a high level, the first clock signal CK is at a high level, the thirteenth transistor M13 is turned off, and the first node N1 remains at a high level. The twelfth transistor M12 is turned on, the potential of the first node N1 is transmitted to the third node N3, and the third node N3 remains at a high level. The sixth transistor M6 is turned off, the fourth node N4 remains at a low level, the fifth transistor M5 is turned off, and the third transistor M3 is turned on. The first voltage signal VGH is transmitted to the fifth node N5, and the fifth node N5 is at a high level. The second clock signal XCK is at a low level, and the first transistor M1 is turned on. The third node N3 is at a high level, the fifteenth transistor M15 is turned off, the second node N2 becomes to be at a low level, and the fourteenth transistor M14 is turned on. The first voltage signal VGH is transmitted to the output signal OUT, and the output signal OUT outputs a high level.

In the period T3, the input signal IN is at a high level, the first clock signal CK is at a low level, the thirteenth transistor M13 is turned on, and the input signal IN is transmitted to the first node N1, such that the first node N1 is at a high level. The twelfth transistor M12 is turned on, the potential of the first node N1 is transmitted to the third node N3, and the third node N3 is at a high level. The sixth transistor M6 is turned on, the second voltage signal VGL is transmitted to the fourth node N4, the fourth node N4 is at a low level, the fifth transistor M5 is turned off, and the third transistor M3 is turned on. The first voltage signal VGH is transmitted to the fifth node N5, and the fifth node N5 is at a high level. The second clock signal XCK is at a high level, and the first transistor M1 is turned off. The third node N3 is at a high level, the fifteenth transistor M15 is turned off, the second node N2 remains at a low level, and the fourteenth transistor M14 is turned on. The first voltage signal VGH is transmitted to the output signal OUT, and the output signal OUT outputs a high level.

In the period T4, the input signal IN is at a low level, the first clock signal CK is at a high level, the thirteenth transistor M13 is turned off, and the first node N1 remains at a high level. The twelfth transistor M12 is turned on, the potential of the first node N1 is transmitted to the third node N3, and the third node N3 remains at a high level. The sixth transistor M6 is turned off, the fourth node N4 remains at a low level, the fifth transistor M5 is turned off, and the third transistor M3 is turned on. The first voltage signal VGH is transmitted to the fifth node N5, and the fifth node N5 is at a high level. The second clock signal XCK is at a low level, and the first transistor M1 is turned on. The third node N3 is at a high level, the fifteenth transistor M15 is turned off, the clock signal XCK is at a low level, the second node N2 remains at a low level, and the fourteenth transistor M14 is turned on. The first voltage signal VGH is transmitted to the output signal OUT, and the output signal OUT outputs a high level.

In the period T5, the input signal IN is at a low level, the first clock signal CK is at a low level, the thirteenth transistor M13 is turned on, and the input signal IN is transmitted to the first node N1, such that the first node N1 is at a low level. The twelfth transistor M12 is turned on, the potential of the first node N1 is transmitted to the third node N3, and the third node N3 is at a low level. The sixth transistor M6 is turned on, the second voltage signal VGL is transmitted to the fourth node N4, the fourth node N4 is at a low level, the fifth transistor M5 is turned off, and the third transistor M3 is turned on. The first voltage signal VGH is transmitted to the fifth node N5, and the fifth node N5 is at a high level. The second clock signal XCK is at a high level, and the first transistor M1 is turned off. The second node N2 is at a high level, the fourteenth transistor M14 is turned off, the third node N3 is at a low level, and the fifteenth transistor M15 is turned on. The second voltage signal VGL is transmitted to the output signal OUT, and the output signal OUT outputs a low level.

In the period T6, the input signal IN is at a low level, the first clock signal CK is at a high level, the thirteenth transistor M13 is turned off, and the first node N1 remains at a low level. The twelfth transistor M12 is turned on, the potential of the first node N1 is transmitted to the third node N3, and the third node N3 remains at a low level. The sixth transistor M6 is turned off, the tenth transistor M10 is turned on, the eleventh transistor M11 is turned on, the second clock signal XCK is at a low level, and the ninth transistor M9 is turned on. The first voltage signal VGH is transmitted to the fourth node N4, the fourth node N4 is at a high level, the fifth transistor M5 is turned on, and the third transistor M3 is turned off. The second voltage signal VGL is transmitted to the fifth node N5, and the fifth node N5 is at a low level. The second clock signal XCK is at a low level, and the first transistor M1 is turned on. The second node N2 remains at a high level, the fourteenth transistor M14 is turned off, the third node N3 is at a low level, and the fifteenth transistor M15 is turned on. The second voltage signal VGL is transmitted to the output signal OUT, and the output signal OUT outputs a low level.

In the period T6, the second voltage signal VGL is transmitted to the fifth node N5, the fifth node N5 is at a low level, and thus the low-level signal of the first node N1 may be remained. Accordingly, the low-level signal of the third node N3 may be remained. As such, the stability of the output signal OUT generated by the third control unit 30 may be improved, and thus the stability of the output signal of the driving circuit 100 may be improved.

In some embodiments, in the period T5, when the first clock signal CK rises from a low level to a high level, the fourth node N4 changes from a low level to a high level, the fifth transistor M5 is turned on, and the third Transistor M3 is tuned off. The second voltage signal VGL is transmitted to the fifth node N5, and the fifth node N5 is at a low level. Thus, in the period T6, the second clock signal XCK is at a low level. When the first transistor M1 is turned on, the fifth node N5 is already a low-level signal. The fifth node N5 may not raise the low level of the first node N1 signal, and thus the low-level signal of the first node N1 may be further maintained. As such, the low-level signal of the third node N3 may be remained. Accordingly, the stability of the output signal OUT generated by the third control unit 30 may be improved, and the stability of the signal output by the driving circuit 100 may be improved.

Figure 16:
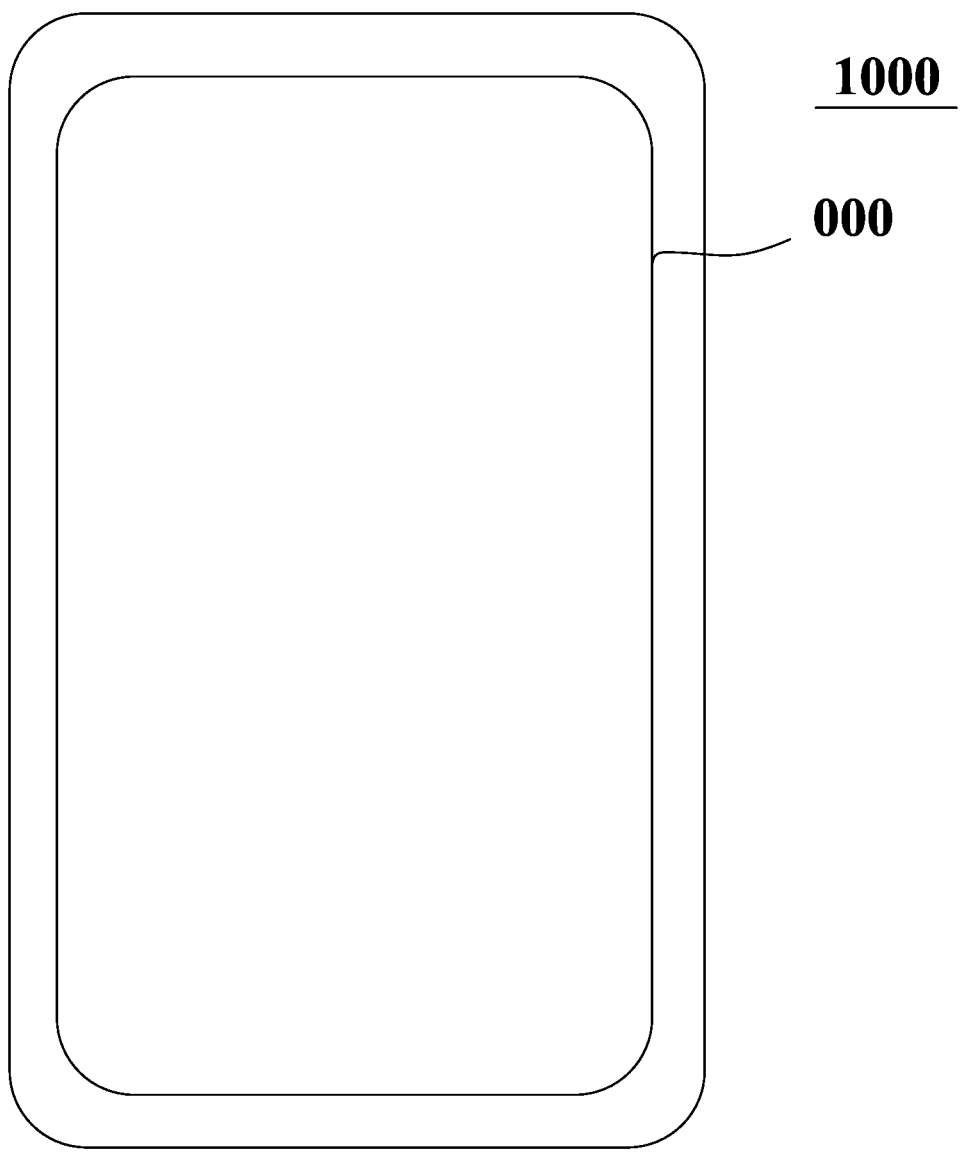
FIG. 16 illustrates is a schematic plan view of a display device consistent with the disclosed embodiments of the present disclosure.

FIG. 16 illustrates is a schematic plan view of a display device consistent with the disclosed embodiments of the present disclosure. The present disclosure also provides a display device. As shown in FIG. 16, the display device 1000 includes a display panel 000 provided by the present disclosure. FIG. 16 only uses a mobile phone as an example to illustrate the display device 1000. It may be understood that the display device 1000 provided in the present disclosure may also be a computer, a television, a vehicle-mounted display device, and other display devices 1000 having display functions, and is not specifically limited in the present disclosure. The display device 1000 provided by the present disclosure has beneficial effects of the display panel 100 provided by the present disclosure. For details, reference may be made to specific descriptions of the display panel 000 provided by the present description, and is not be repeated here.

As disclosed, the technical solutions of the present disclosure have the following advantages.

In a display panel provided by the present disclosure, a second control unit may include an adjustment unit. The adjustment unit may be used to maintain a low-level signal of a first node, when a signal of the first node and a signal of the third node are each a low-level signal, and a second clock signal is a low-level signal. Thus, the low-level signal of the third node may be maintained. Accordingly, stability of an output signal generated by a third control unit may be improved, and stability of a signal output by a driving circuit may thus be improved.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equivalents, or improvements to the disclosed embodiments are intended to be encompassed within the scope of the present disclosure.

What is claimed is:

1. A display panel, comprising a driving circuit, wherein:
   the driving circuit includes N levels of shift registers cascaded with each other, wherein N ≥ 2; and
   a shift register of the N levels of shift registers includes:
   a first control unit, configured to receive an input signal and control a signal of a first node in response to a first clock signal;
   a second control unit, configured to receive a first voltage signal and a second voltage signal, and control a signal of a second node in response to the signal of the first node, the first clock signal, and a second clock signal; and a third control unit, configured to receive the first voltage signal and the second voltage signal, and control an output signal in response to the signal of the second node and a signal of a third node, wherein the third node is connected to the first node, the first voltage signal is a high-level signal, and the second voltage signal is a low-level signal, wherein:
the second control unit includes an adjustment unit; and
the adjustment unit is configured to, when the signal of the first node and the signal of the third node are each a low-level signal, and the second clock signal is a low-level signal, maintain the low-level signal of the first node.

2. The display panel according to claim 1, wherein:
the second control unit include a first sub-control unit, a second sub-control unit and a third sub-control unit;
the first sub-control unit is configured to at least receive the second voltage signal, and control a signal of a fourth node in response to the first clock signal and the signal of the first node;
the second sub-control unit is configured to receive the first voltage signal and a signal of the fourth node, and control the signal of the second node in response to the second clock signal and the signal of the first node; and
the third sub-control unit is connected between the first voltage signal and the first node, and the third sub-control unit includes the adjustment unit.

3. The display panel according to claim 2, wherein:
the third sub-control unit includes a first transistor, wherein a source of the first transistor is connected to a fifth node, and a drain of the first transistor is connected to the first node, and the fifth node is coupled to the first voltage signal; and
the adjustment unit is configured to control a signal of the fifth node, or to control turn-on and turn-off of the first transistor.

4. The display panel according to claim 3, wherein:
the adjustment unit is configured to control the first transistor to remain turned-off when the signal of the first node and the signal of the third node are each a low-level signal, the first clock signal is a high-level signal, and the second clock signal is a low-level signal.

5. The display panel according to claim 4, wherein:
the adjustment unit is configured to receive the second clock signal, and control gate potential of the first transistor in response to the signal of the fourth node.

6. The display panel according to claim 5, wherein:
the adjustment unit includes a second transistor, wherein a gate of the second transistor is connected to the fourth node, a source of the second transistor is configured to receive the second clock signal, and a drain of the second transistor is connected to the gate of the first transistor.

7. The display panel according to claim 6, wherein:
the fifth node is directly connected to the first voltage signal.

8. The display panel according to claim 7, wherein:
the third sub-control module includes a third transistor, wherein a source of the third transistor is connected to the first voltage signal, a drain of the third transistor is connected to the fifth node, and a gate of the third transistor is coupled to the fourth node.

9. The display panel according to claim 8, wherein:
the third sub-control module includes a fourth transistor, wherein a source of the fourth transistor is connected to the fourth node, a gate of the fourth transistor is connected to the second clock signal, and a drain of the fourth transistor is connected to the gate of the third transistor.

10. The display panel according to claim 3, wherein:
the adjustment unit is configured to, when the signal of the first node and the signal of the third node are each a low-level signal, the first clock signal is a low-level signal, and the second clock signal is a high-level signal, control the fifth node to be disconnected from the first voltage signal.

11. The display panel according to claim 10, wherein:
the third sub-control module includes a third transistor, wherein a source of the third transistor is connected to the first voltage signal, a drain of the third transistor is connected to the fifth node, and a gate of the third transistor is coupled to the adjustment unit; and
the adjustment unit is configured to receive the signal of the fourth node and control gate potential of the third transistor in response to the second clock signal.

12. The display panel according to claim 11, wherein:
the adjustment unit includes a fourth transistor, wherein a source of the fourth transistor is connected to the fourth node, a gate of the fourth transistor is connected to the second clock signal, and a drain of the fourth transistor is connected to the gate of the third transistor.

13. The display panel according to claim 3, wherein:
the adjustment unit is configured to, when the signal of the first node and the signal of the third node are each a low-level signal, and the first clock signal is a high-level signal, control the signal of the fifth node to be a low-level signal.

14. The display panel according to claim 13, wherein:
the third sub-control module includes a third transistor, wherein a source of the third transistor is connected to the first voltage signal, a drain of the third transistor is connected to the fifth node, and a gate of the third transistor is coupled to the fourth node; and
the adjustment unit is configured to receive the second voltage signal, and control the signal of the fifth node in response to the signal of the fourth node.

15. The display panel according to claim 14, wherein:
when the signal of the fourth node is a high-level signal, the adjustment unit is turned on; and
when the signal of the fourth node is a low-level signal, the adjustment unit is turned off.

16. The display panel according to claim 14, wherein:
the adjustment unit includes a fifth transistor, wherein a source of the fifth transistor is connected to the second voltage signal, a drain of the fifth transistor is connected to the fifth node, and a gate of the fifth transistor is connected to the fourth node.

17. The display panel according to claim 16, wherein:
the first transistor and the third transistor are each a PMOS transistor, and the fifth transistor is an NMOS transistor.

18. The display panel according to claim 2, wherein:
the first sub-control unit includes a sixth transistor and a seventh transistor; and
the second sub-control unit includes an eighth transistor, a ninth transistor, a tenth transistor, and a first capacitor, wherein:
a source of the sixth transistor is connected to the second voltage signal, a drain of the sixth transistor is connected to the fourth node, and a gate of the sixth transistor is connected to the first clock signal;

a source of the seventh transistor is connected to the first clock signal, a drain of the seventh transistor is connected to the fourth node, and a gate of the seventh transistor is connected to the first node;

a source of the eighth transistor is connected to the second clock signal, a drain of the eighth transistor is connected to the sixth node, and a gate of the eighth transistor is connected to the fourth node;

a source of the ninth transistor is connected to the sixth node, a drain of the ninth transistor is connected to the second node, and a gate of the ninth transistor is connected to the second clock signal;

a source of the tenth transistor is connected to the first voltage signal, a drain of the tenth transistor is connected to the second node, and a gate of the tenth transistor is connected to the first node; and a first electrode plate of the first capacitor is connected to the fourth node, and a second electrode plate of the first capacitor is connected to the fifth node;

the second sub-control unit further includes an eleventh transistor and a twelfth transistor, wherein:

a source of the eleventh transistor is connected to the fourth node, a drain of the eleventh transistor is connected to the gate of the eighth transistor, and a gate of the eleventh transistor is connected to the second voltage signal; and a source of the twelfth transistor is connected to the first node, a drain of the twelfth transistor is connected to the third node, and a gate of the twelfth transistor is connected to the second voltage signal.

19. The display panel according to claim 1, wherein:
the first control unit includes a thirteenth transistor; and
the third control unit includes a fourteenth transistor, a fifteenth transistor, a second capacitor, and a third capacitor, wherein:

a source of the thirteenth transistor is connected to the input signal, a drain of the thirteenth transistor is connected to the first node, and a gate of the thirteenth transistor is connected to the first clock signal;

a source of the fourteenth transistor is connected to the first voltage signal, a drain of the fourteenth transistor is connected to the output signal, and a gate of the fourteenth transistor is connected to the second node;

a source of the fifteenth transistor is connected to the second voltage signal, a drain of the fifteenth transistor is connected to the output signal, and a gate of the fifteenth transistor is connected to the third node;

a first electrode plate of the second capacitor is connected to the first voltage signal, and a second electrode plate of the second capacitor is connected to the second node; and a first electrode plate of the third capacitor is connected to the third node, and a second electrode plate of the third capacitor is connected to the second voltage signal or the output signal.

20. A display device, comprising a display panel including a driving circuit, wherein:
the driving circuit includes N levels of shift registers cascaded with each other, wherein $N \geq 2$; and
a shift register of the N levels of shift registers includes:
a first control unit, configured to receive an input signal and control a signal of a first node in response to a first clock signal;

a second control unit, configured to receive a first voltage signal and a second voltage signal, and control a signal of a second node in response to the signal of the first node, the first clock signal, and a second clock signal; and a third control unit, configured to receive the first voltage signal and the second voltage signal, and control an output signal in response to the signal of the second node and a signal of the third node, wherein the third node is connected to the first node, the first voltage signal is a high-level signal, and the second voltage signal is a low-level signal, wherein:
the second control unit includes an adjustment unit; and
the adjustment unit is configured to, when the signal of the first node and the signal of the third node are each a low-level signal, and the second clock signal is a low-level signal, maintain the low-level signal of the first node.

* * * * *